(12) United States Patent
Hsieh et al.

(10) Patent No.: US 10,177,290 B2
(45) Date of Patent: Jan. 8, 2019

(54) LIGHT-EMITTING DEVICE

(71) Applicant: EPISTAR CORPORATION, Hsinchu (TW)

(72) Inventors: Min-Hsun Hsieh, Hsinchu (TW); Jen-Chieh Yu, Hsinchu (TW); Wei-Fan Ke, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/482,422

(22) Filed: Apr. 7, 2017

(65) Prior Publication Data

US 2017/0294566 A1 Oct. 12, 2017

(30) Foreign Application Priority Data

Apr. 8, 2016 (TW) .............................. 105110990 A

(51) Int. Cl.
| | |
|---|---|
| *H01L 33/60* | (2010.01) |
| *H01L 23/00* | (2006.01) |
| *H01L 33/00* | (2010.01) |
| *H01L 33/38* | (2010.01) |
| *H01L 33/50* | (2010.01) |
| *H01L 33/62* | (2010.01) |
| *H01L 33/30* | (2010.01) |
| *H01L 33/40* | (2010.01) |
| *H01L 33/46* | (2010.01) |

(52) U.S. Cl.
CPC .............. *H01L 33/60* (2013.01); *H01L 24/13* (2013.01); *H01L 33/0062* (2013.01); *H01L 33/0095* (2013.01); *H01L 33/38* (2013.01); *H01L 33/385* (2013.01); *H01L 33/502* (2013.01); *H01L 33/505* (2013.01); *H01L 33/62* (2013.01); *H01L 33/0079* (2013.01); *H01L 33/30* (2013.01); *H01L 33/40* (2013.01); *H01L 33/46* (2013.01); *H01L 2224/1312* (2013.01); *H01L 2224/13111* (2013.01); *H01L 2924/12041* (2013.01); *H01L 2933/0016* (2013.01); *H01L 2933/0058* (2013.01); *H01L 2933/0066* (2013.01)

(58) Field of Classification Search
CPC ............. H01L 27/3262; H01L 27/3248; H01L 27/3258
See application file for complete search history.

(56) References Cited

U.S. PATENT DOCUMENTS

| 8,350,285 B2 | 1/2013 | Sugizaki et al. |
| 8,436,378 B2 | 5/2013 | Kojima et al. |
| 2005/0271107 A1* | 12/2005 | Murakami ............ H01S 5/0261 372/50.1 |

(Continued)

*Primary Examiner* — Thao P Le
(74) *Attorney, Agent, or Firm* — Muncy, Geissler, Olds & Lowe, P.C.

(57) ABSTRACT

This disclosure discloses a light-emitting device includes a semiconductor stack, an electrode, an electrode post, a reflective insulating layer, an extending electrode, and a supporting structure. The electrode is disposed on a lower surface of the semiconductor stack, and electrically connected to the semiconductor stack. The electrode post is disposed on the electrode. The reflective insulating layer surrounds the electrode post, and has a bottom surface which is coplanar with the electrode post. The extending electrode is disposed on an upper surface of the semiconductor stack. The supporting structure is located on the extending electrode.

20 Claims, 16 Drawing Sheets

(56) References Cited

U.S. PATENT DOCUMENTS

| | | | |
|---|---|---|---|
| 2010/0084626 A1* | 4/2010 | Delhougne | H01L 27/2436 257/4 |
| 2010/0140640 A1* | 6/2010 | Shimokawa | H01L 33/0079 257/98 |
| 2011/0297987 A1* | 12/2011 | Koizumi | H01L 33/44 257/98 |
| 2013/0071984 A1* | 3/2013 | Wang | H01L 45/08 438/382 |
| 2014/0103328 A1* | 4/2014 | Pfeifer | H01L 51/5262 257/40 |
| 2014/0197403 A1* | 7/2014 | Hayashi | H05B 33/26 257/40 |
| 2015/0137169 A1* | 5/2015 | Chen | H04L 33/38 257/99 |
| 2015/0349207 A1* | 12/2015 | Sogo | H01L 33/0079 257/99 |
| 2016/0190409 A1 | 6/2016 | Kuo et al. | |
| 2017/0162745 A1* | 6/2017 | Moriyasu | H01L 33/0079 |

* cited by examiner

LIGHT-EMITTING DEVICE

REFERENCE TO RELATED APPLICATION

This application claims the benefit of TW Application Serial No. 105110990, filed on Apr. 8, 2016, the content of which is hereby incorporated by reference in its entirety.

BACKGROUND

Technical Field

The present disclosure relates to a light-emitting element including a light-emitting device having a transparent supporting structure and an electrode post.

Description of the Related Art

LED (Light-Emitting Diode) has a low power consumption, low heat, long operating life, impact resistance, small size and fast response and other superior optical properties. Therefore, it is widely used in a variety of applications, such as vehicles, home appliances, and lighting fixtures.

The light of single color emitted from an LED can be converted into a different color in several ways. For example, the phosphor can be applied to convert the color of the light from the LED into another color. The phosphor is a photoluminescent material, also known as a wavelength conversion material. The phosphor can absorb the first light from the LED and emit a second light having a color different from the first light. If the first light is not completely consumed by the phosphor, the part of the first light and the second light are mixed to form a mixed light of another color.

However, if the ratio of the first light emitted from the LED and the second light (which is converted from the first light) is different at different angles, an un-uniform phenomenon color can be produced by the first light and the second light at different viewing angles.

SUMMARY OF THE DISCLOSURE

This disclosure discloses a light-emitting device having a semiconductor stack, an electrode, an electrode post, a reflective insulating layer, an extending electrode and a supporting structure. The semiconductor stack has a side surface, a first bottom surface and a first upper surface opposing to the first bottom surface. The electrode is formed on the first bottom surface to be electrically connected to the semiconductor stack. The electrode post is formed on the electrode. The reflective insulating layer surrounds the electrode post and has a second bottom surface being coplanar with the electrode post. The extending electrode is formed on the first upper surface. The supporting structure is formed on the extending electrode.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure accompanied with the drawings.

Figure 1:
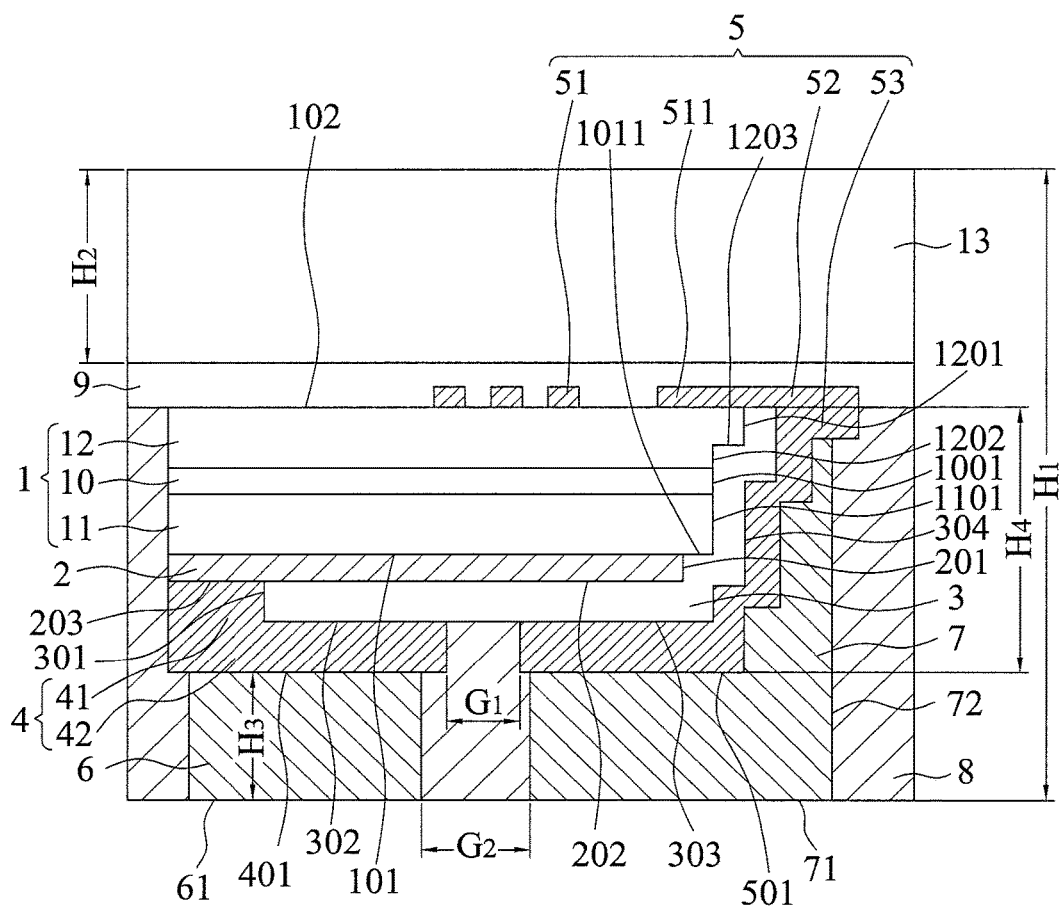
FIG. 1 shows a cross-sectional view of a light-emitting device in accordance with one embodiment of the present disclosure.
Figure 2A:
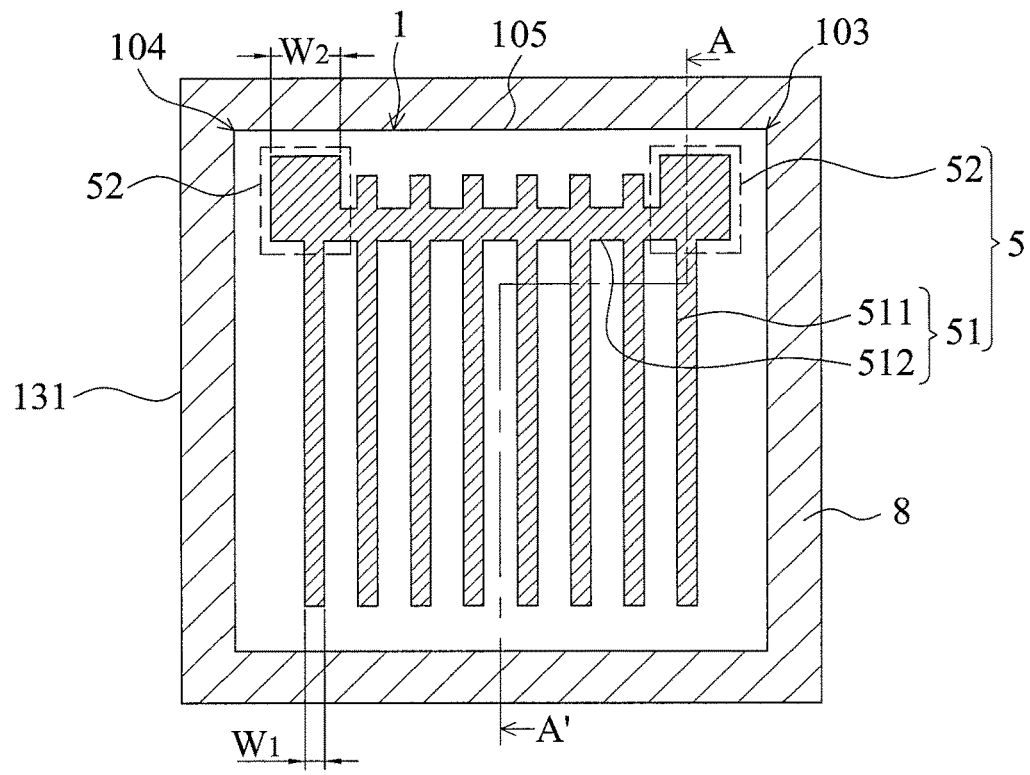
FIG. 2A shows a stop view of a light-emitting device in accordance with one embodiment of the present disclosure.
Figure 2B:
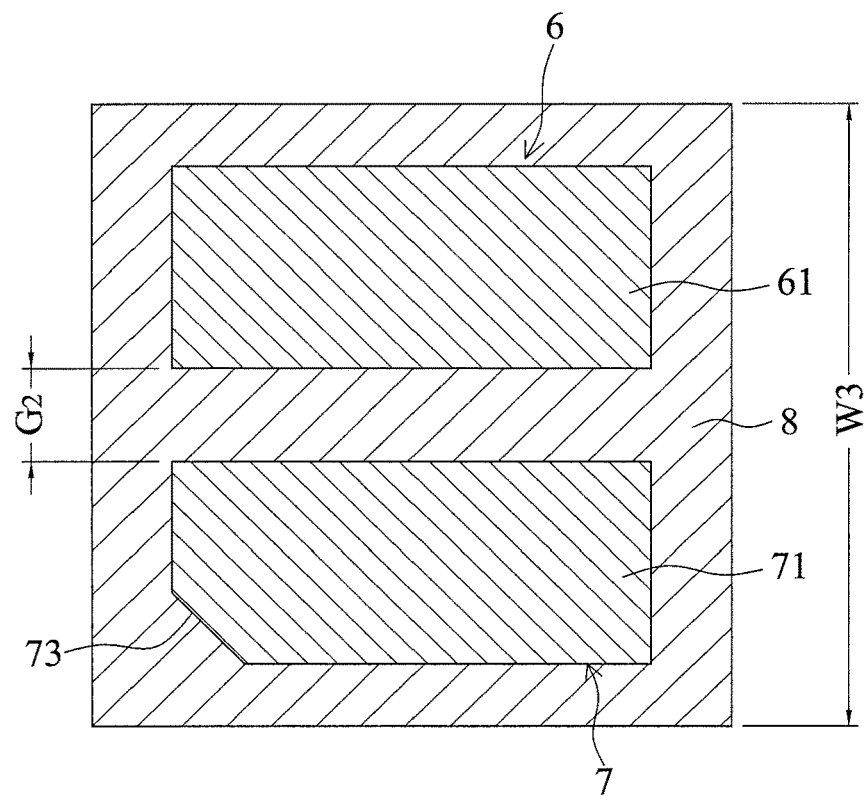
FIG. 2B shows a bottom view of a light-emitting device in accordance with one embodiment of the present disclosure.

FIG. 1 shows a schematic view of a light-emitting device in accordance with one embodiment of the present disclosure. FIG. 2A shows a top view of a light-emitting device 100, and FIG. 2B shows a bottom view of the light-emitting device 100. FIG. 1 shows a cross-sectional view along the line AA' in FIG. 2A. As shown in FIG. 1, the light-emitting device 100 includes a semiconductor stack 1, a reflective conductive layer 2, an insulating layer 3, a first electrode 4, a second electrode 5, a first electrode post 6, a second electrode post 7, a reflective insulating layer 8, an adhesive layer 9, and a supporting structure 13. The semiconductor stack 1 includes a first semiconductor layer 11, a second semiconductor layer 12, and an active layer 10 formed between the first semiconductor layer 11 and the second semiconductor layer 12. The second semiconductor layer 12 has a stepped structure on one side. In detail, the second semiconductor layer 12 has a first side surface 1201 and a second side surface 1202 that are not coplanar with each other on the right side. The first side surface 1201 and the second side surface 1202 are connected to each other through a platform 1203. The first side surface 1101 of the first semiconductor layer 11, the first side surface 1001 of the active layer 10 and the second side surface 1202 of the second semiconductor layer 12 are substantially coplanar with each other. The left side surfaces of the first semiconductor layer 11, the second semiconductor layer 12, and the left side surface of the active layer 10 with respect to the right side surfaces (1001, 1101, 1201, and 1202) are substantially coplanar with each other. The first semiconductor layer 11 and the second semiconductor layer 12 have different types of conductivity, electrical properties, polarities, or dopants. The active layer 10 is formed between the first semiconductor layer 11 and the second semiconductor layer 12 to convert electricity into light. The wavelength of the light can be adjusted by modifying the physical composition(s) and/or chemical composition(s) of one or more layers of the semiconductor stack 1. The material of the semiconductor stack 1 includes Aluminum gallium indium phosphide (AlGaInP) based material, aluminum gallium indium nitride (AlGaInN) based material, and zinc oxide (ZnO) based material. The active layer 10 can be a single heterostructure (SH), a doublehetero structure (DH), a double-side double heterostructure (DDH), or a multi-quantum well (MWQ). To be more specific, the active layer 10 may be a neutral conductive type, a p-type or an n-type semiconductor layer. When the current flows through the semiconductor stack 1, the active layer 10 emits light. When the active layer 10 includes aluminum indium gallium phosphide (AlGaInP) based material, the red, orange, yellow and amber light can be emitted. The blue or green light can be emitted when the active layer 10 includes aluminum gallium nitride (AlGaInN) based material. In one embodiment, the semiconductor stack 1 includes $Al_xIn_yGa_{(1-x-y)}P$, where $0 \le x, y \le 1$; $(x+y) \le 1$ and emits a red light having a peak wavelength or dominant wavelength between 610 and 650 nm.

The reflective conductive layer 2 is formed on the bottom surface 101 of the semiconductor stack 1 to cover at least a part of the bottom surface 101 of the semiconductor stack 1 and is electrically connected to the first semiconductor layer 11. However, the conduction type between the first semiconductor layer 11 and the reflective conductive layer 2 can be ohmic contact or schottky contact depends on the combination of the materials and the manufacturing method thereof. For example, the reflective conductive layer 2 includes germanium (Ge), gold (Au), chromium (Cr), and/or titanium (Ti) to form an ohmic contact with the first semiconductor layer 11. As shown in FIG. 1, the bottom surface 101 of the semiconductor stack 1 has a first portion 1011 not covered by the reflective conductive layer 2 to prevent the reflective conductive layer 2 from climbing on the side surface of the semiconductor stack 1 and forming a short-circuited structure with the active layer 10. The first side surface 201 of the reflective conductive layer 2 is not in coplanar with the first side surface 1101 of the first semiconductor layer 11 while another side surface opposite to the first side surface 201 is coplanar with another side surface opposite to the first side surface 1101 of the first semiconductor layer 11. The reflective conductive layer 2 is formed of a metal having high reflectivity to reflect the light emitted from the active layer 10 so that light can be emitted from the light emitting surface 102. The light emitting surface 102 locates on the opposite side with respect to the bottom surface 101. The material of the reflective conductive layer 2 includes metal, such as germanium (Ge), beryllium (Be), silver (Ag), gold (Au), aluminum (Al), indium (In), nickel (Ni), tin (Sn), titanium (Ti) or platinum (Pt), or the like and the stack or combination thereof. The insulating layer 3 covers the first side surface 1201, the platform 1203, and the second side surface 1202 of the second semiconductor layer 12, the first side surface 1001 of the active layer 10, the first side surface 1101 of the first semiconductor layer 11, the first portion 1011 of the bottom surface 101 of the semiconductor stack 1, a first side surface 201 of the reflective conductive layer 2, and a first portion 202 of the bottom surface of the reflective conductive layer 2. Thus, the insulating layer 3 has a topography similar to the uneven outer side surface including the first side surface 1201, the platform 1203, and the second side surface 1202, the first side surface 1001, the first side surface 1101, the first portion 1011, a first side surface 201 and a first portion 202 of the semiconductor stack 1. However, the second portion 203 of the bottom surface of the reflective conductive layer 2 is not covered by the insulating layer 3. The material of the insulating layer 3 contains an organic material, an inorganic material, or both. Organic materials can be Su8, benzocyclobutene (BCB), perchlorocyclobutane (PFCB), epoxy resin (Epoxy), acrylic resin (Acrylic Resin), cycloolefin polymer (COC), polymethylmethacrylate (PMMA), polyethylene terephthalate (PET), polycarbonate (PC), polyetherimide, fluorocarbon polymer. The inorganic materials can be silicone, glass, alumina ($Al_2O_3$), silicon nitride ($SiN_x$), silicon oxide ($SiO_2$), titanium dioxide ($TiO_2$), or magnesium fluoride ($MgF_2$).

The first electrode 4 covers the second portion 203 of the bottom surface of the reflective conductive layer 2 and extends along the first side surface 301 of the insulating layer 3 toward the bottom surface of the insulating layer 3. The first electrode 4 covers the first portion 302 of the bottom surface of the insulating layer 3 and is electrically connected to the reflective conductive layer 2. In detail, the first electrode 4 includes a connecting portion 41 and an extending portion 42. The connecting portion 41 covers the second portion 203 of the bottom surface of the reflective conductive layer 2, which is not covered by the insulating layer 3, and the first side surface 301 of the insulating layer 3. The extending portion 42 extends from the connecting portion 41 and covers the first portion 302 of the bottom surface of the insulating layer 3. The first electrode 4 includes titanium (Ti), tungsten (W), platinum (Pt), nickel (Ni), tin (Sn), gold (Au), aluminum (Al), alloys of the above materials, or the stack of the above materials.

As shown in FIGS. 1 and 2A, the second electrode 5 includes a first extending portion 51, a connecting portion 52 and a second extending portion 53. The first extension portion 51 is located on the light emitting surface 102 of the semiconductor stack 1 and is electrically connected to the second semiconductor layer 12. The connecting portion 52 is formed on the light emitting surface 102 of the semiconductor stack 1 and is close to the edge of the semiconductor stack 1. The connecting portion 52 is connected to the second extending portion 53 and the first extending portion 51. Referring to FIG. 2A, the first extending portion 51 has a width W1, which is in a range of 7 to 9 μm. The connecting portion 52 has a width W2, which is larger than W1. The second extending portion 53 extends from the connection portion 52 toward the semiconductor stack 1 along the insulating layer 3 and covers the second side surface 304 of the insulating layer 3 and the second portion 303 of the bottom surface of the insulating layer 3. In detail, the insulating layer 3 has a stepped shape, and the second extending portion 53 covering the insulating layer 3 has a similar appearance compared with the insulating layer 3 under an appropriate thickness. In other words, the second extending portion 53 extends downwardly from the connecting portion 52 and replicates the second side surface 304 of the insulating layer 3 and the contour of the second portion 303 of the bottom surface. Thus, the second electrode 5 is separated from the active layer 10, the first semiconductor layer 11, and the reflective conductive layer 2 by the insulating layer 3. That is, a distance G1 is formed between the first portion 302 and the second portion 303 of the lower surface of the insulating layer, and the distance G1 is in a range between 70 μm to 250 μm. As shown in FIG. 2A, the first extending portion 51 includes a plurality of mutually parallel first extending electrodes 511 and a second extending electrode 512. The second extending electrode 512 is connected to the connecting portion 52 located on the corner 103 and the corner 104 of the semiconductor stack 1. The first extending electrode 511 located on the outermost position is directly connected with the connecting portion

52. The first extending electrode 511 which is not connected to the connecting portion 52 crosses the extending electrode 512 along a perpendicular direction to form a plurality of intersections. The second extending electrode 512 is close to and substantially parallel to a side 105 of the semiconductor stack 1. The first extending portion 51 and the connecting portion 52 include a metal, a transparent oxide, or a combination thereof. The metal can be gold (Au), germanium (Ge), beryllium (Be), nickel (Ni), palladium (Pd), zinc (Zn), alloys of the above materials, or a stack of the above materials. The transparent oxide can be indium tin oxide (ITO), indium oxide (InO), tin oxide (SnO), cadmium tin oxide (CTO), antimony tin oxide (ATO), aluminum zinc oxide (AZO), zinc tin oxide (ZTO) or zinc oxide (ZnO). The second extending portion 53 includes titanium (Ti), tungsten (W), platinum (Pt), nickel (Ni), tin (Sn), gold (Au) or alloys thereof. As described above, the first extending portion 51, the connecting portion 52, and the second extending portion 53 may include a same material or different materials.

The first electrode post 6 is formed on the bottom surface 401 of the first electrode 4 away from the light emitting surface 102. The second electrode post 7 is formed on the bottom surface 501 of the second electrode 5 away from the light emitting surface 102 and also covers the uneven outer side surface of the second extending portion 53 of the second electrode 5. Thus, the second electrode post 7 has an outer side surface 72 perpendicular to the light-emitting surface. The bottom surface 61 of the first electrode post 6 is substantially coplanar with the bottom surface 71 of the second electrode post 7. As shown in FIG. 2B, in order to distinguish the conductivity type of the first electrode post 6 and the second electrode post 7 by their appearance, the shapes of the bottom surfaces of the first electrode post 6 and the second electrode post 7 can be different and the appearances of the bottom surfaces of the first electrode post 6 and the second electrode post 7 can be similar, for example, as a quadrangular. For example, the bottom surface of the second electrode post 7 has an oblique edge 73 as a sign of anode or to show its electrical connection with the p-type semiconductor layer. In that case, the first electrode post 6 is a cathode or electrical connected to the n-type semiconductor layer. The first electrode post 6 and the second electrode post 7 may include gold (Au), copper (Cu), tin (Sn), antimony (Sb), silver (Ag), titanium (Ti), platinum (Pt), nickel (Ni), alloys of the above materials, or a stack of the above materials. In one embodiment, the first electrode post 6 and the second electrode post 7 includes tin-antimony alloy. In another embodiment, the first electrode post 6 and the second electrode post 7 includes a titanium-copper stack.

The reflective insulating layer 8 surrounds the side surface of the semiconductor stack 1, the side surface of the reflective conductive layer 2, the side surface and the bottom surface of the insulating layer 3, the side surface of the first electrode 4, the side surface of the second electrode 5, the side surface of the first electrode post 6, and the side surface of the second electrode post 7. The reflective insulating material of the reflective insulating layer 8 also fills the gap between the first electrode 4 and the second electrode 5 and the gap between the first electrode post 6 and a second electrode post 7. The reflective insulating material does not cover the bottom surface 61 of the first electrode post 6 and the bottom surface 71 of the second electrode post 7. The bottom surface of the reflective insulating layer 8 is substantially coplanar with the bottom surfaces of the first electrode post 6 and the second electrode post 7 for the first electrode post 6 and the second electrode post 7 to be electrically connected to an external circuit. The reflective insulating layer 8 can protect the semiconductor stack 1 and reflect the light from the active layer 10 so the light is emitted from the light emitting surface 102 of the semiconductor stack 1. The reflective insulating layer 8 includes a matrix and a high reflectivity material. The matrix can be a silicone-based or epoxy-based material; the high reflectivity material can be titanium dioxide, silicon dioxide, or alumina.

The adhesive layer 9 is formed on the light emitting surface 102 of the semiconductor stack 1 and the reflective insulating layer 8 and covers the first extending portion 51 and the connecting portion 52 of the second electrode 5. The supporting structure 13 is bonded to the light emitting surface 102 and the reflective insulating layer 8 by the adhesive layer 9, and the light emitted from the active layer 10 can penetrates the adhesive layer 9 and the supporting structure 13 and travels in a direction away from the first extending portion 51 of the second electrode 5. The adhesive layer 9 includes a material which is transparent or translucent with respect to the light emitted from the active layer 10, such as organic material or inorganic material. The organic material can be Su8, benzocyclobutene (BCB), perchlorocyclobutane (PFCB), epoxy resin (epoxy), acrylic resin, cycloolefin polymer (COC), polymethylmethacrylate (PMMA), polyethylene terephthalate (PET), polycarbonate (PC), polyetherimide, or fluorocarbon polymer. The inorganic material can be silicone, glass, alumina($Al_2O_3$), silicon nitride ($SiN_x$), silicon oxide ($SiO_2$), titanium dioxide ($TiO_2$), or magnesium fluoride ($MgF_2$). The supporting structure 13 includes a material which is transparent or translucent with respect to the light emitted from the active layer 10, such as gallium arsenide (GaAs), gallium phosphide (GaP), gallium nitride (GaN), sapphire, diamond, glass, quartz, acryl, zinc oxide (ZnO) or aluminum nitride (AlN). In one embodiment, the supporting structure 13 includes a wavelength converting material (e.g., inorganic phosphor, organic fluorescent colorant, semiconductor, or a combination thereof). In another embodiment, the supporting structure 13 does not include a wavelength converting material, and a wavelength converting layer (not shown) is formed between the supporting structure 13 and the first extending portion 51 of the second electrode 5, and between the supporting structure 13 and the connecting portion 52 of the second electrode 5.

In one embodiment, a transparent conductive layer (not shown) is provided between the first extending portion 51 and the light emitting surface 102 of the semiconductor stack 1, and between the connecting portion 52 and the light emitting surface 102 of the semiconductor stack 1. The transparent conductive layer is electrically connected to the second semiconductor layer 12, the first extending portion 51, and the connecting portion 52 to improve current flow in the lateral direction. The transparent conductive layer applied in the structure can help to spread the current so less amount of the first extending portion 51 is needed. Or the transparent conductive layer may further replace the first extending portion 51 so the light-shielding area of the first extending portion 51 is reduced to increase the ratio of light transmission. The transparent conductive layer includes but is not limited to indium tin oxide (ITO), indium oxide (InO), indium zinc oxide (IZO), tin oxide (SnO), cadmium tinoxide (CTO), antimony oxide (ATO), aluminum zinc oxide (AZO), zinc tin oxide (ZTO), zinc oxide (ZnO), or gallium phosphide (GaP).

As shown in FIG. 1, the light-emitting device 100 has a height H1, the supporting structure 13 has a height H2, the first electrode post 6 has a height H3, and a height between the light-emitting surface 102 and the bottom surface 401 is H4. The height H1 is between 550 μm and 670 μm, the height H2 is between 500 μm and 650 μm, the height H4 is between 7 μm and 15 μm, and the height H3 is between 15 μm and 80 μm, wherein the ratio of H1/H2 is less than 1.5. In another embodiment, the ratio of H1/H2 is in the range of 1.34 to 1.03. For example, the ratio of H1/H2 is 1.13. The ratio of H1/H3 is in the range of 8 to 45, or 8 to 15. For example, the ratio of H1/H2 is 10. As shown in FIG. 1 and FIG. 2B, the light emitting device 100 has a width W3, a distance G2 between the first electrode post 6 and the second electrode post 7, and the distance G2 may be optionally greater than or equal to the distance G1 between the first electrode 4 and the second electrode 5. The width W3 is in the range of 850 μm to 1150 μm. For example, the width W3 is 1000 μm. The distance G2 is in the range of 150 μm to 250 μm. For example, the distance G2 is 200 μm.

Figure 3A:
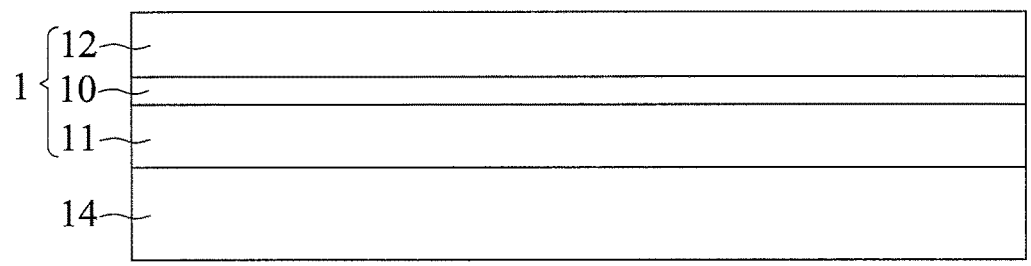
FIGS. 3A~3I show a manufacturing process of a light-emitting device in accordance with one embodiment of the present disclosure.

FIGS. 3A~3I show a manufacturing process of a light-emitting device in accordance with one embodiment of the present disclosure. As shown in FIG. 3A, a growth substrate 14 is provided to form a semiconductor stack 1 including a first semiconductor layer 11, an active layer 10, and a second semiconductor layer 12 on the growth substrate 14. The growth substrate 14 includes sapphire, silicon carbide (SiC), gallium nitride (GaN), gallium arsenide (GaAs), or gallium phosphide (GaP).

Figure 3B:
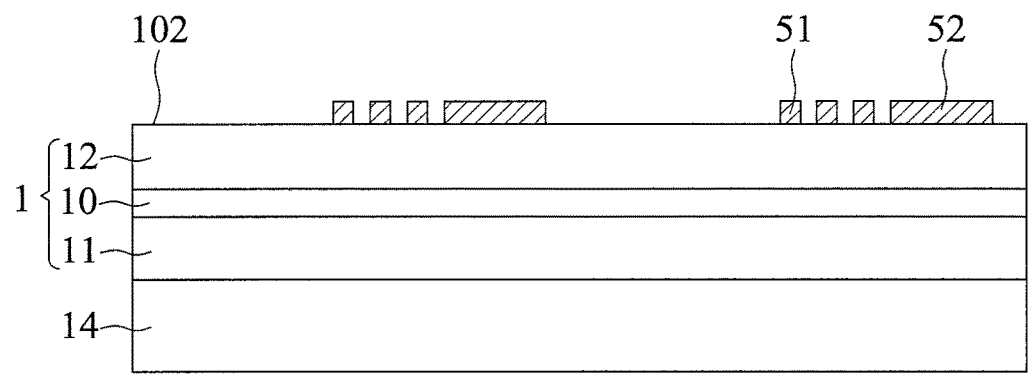

As shown in FIG. 3B, the first extending portion 51 and the connecting portion 52 of the second electrode 5 are formed on the light emitting surface 102 of the semiconductor stack 1 by vapor deposition, wherein the first extending portion 51 and the connecting portion 52 are connected with each other on the light emitting surface 102.

Figure 3C:
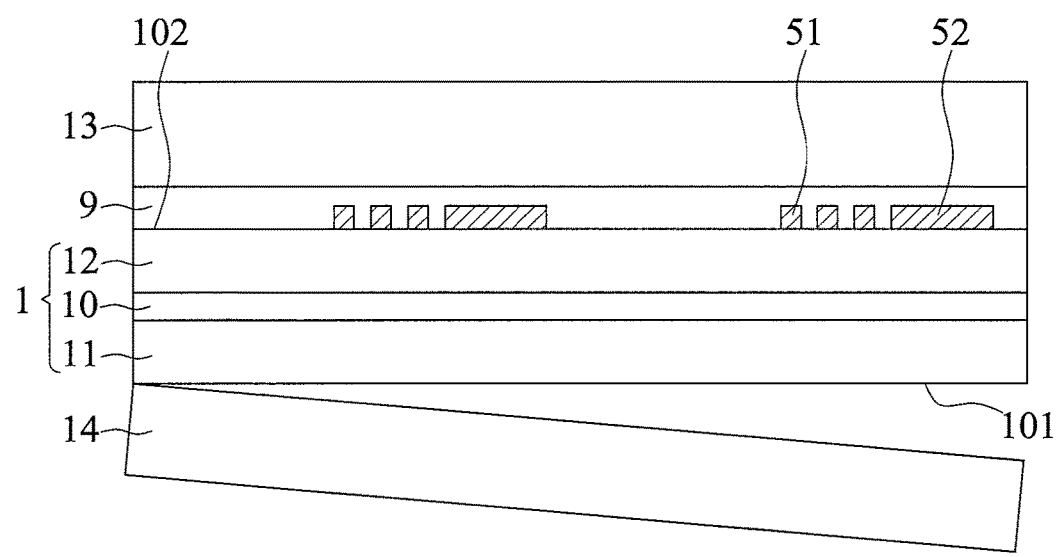

Then, as shown in FIG. 3C, a supporting structure 13 is provided to be connected to the light emitting surface 102 of the semiconductor stack 1 through an adhesive layer 9. For example, the alignment bonding technique is applied by laminating the adhesive layer 9 with the light-emitting surface 102 of the semiconductor stack 1 and then the adhesive layer 9, the light emitting surface 102, and the supporting structure 13 are combined by the heating and pressing. Next, the growth substrate 14 is separated from the semiconductor stack 1 to expose the bottom surface 101 of the semiconductor stack 1. The method of separating the growth substrate 14 includes the laser-lift technology which using laser beam to penetrate the growth substrate 14 and irradiates the interface between the growth substrate 14 and the semiconductor stack 1 to separate the semiconductor stack 1 and the growth substrate 14. Alternatively, the growth substrate 14 can be directly removed by wet etching or the interface layer (not shown) between the growth substrate 14 and the semiconductor stack 1 can be removed to separate the growth substrate 14 from the semiconductor stack 1. In addition, the interface layer (not shown) between the growth substrate 14 and the semiconductor stack 1 can be removed by vapor etching at a high temperature to separate the growth substrate 14 from the semiconductor stack 1.

Figure 3D:
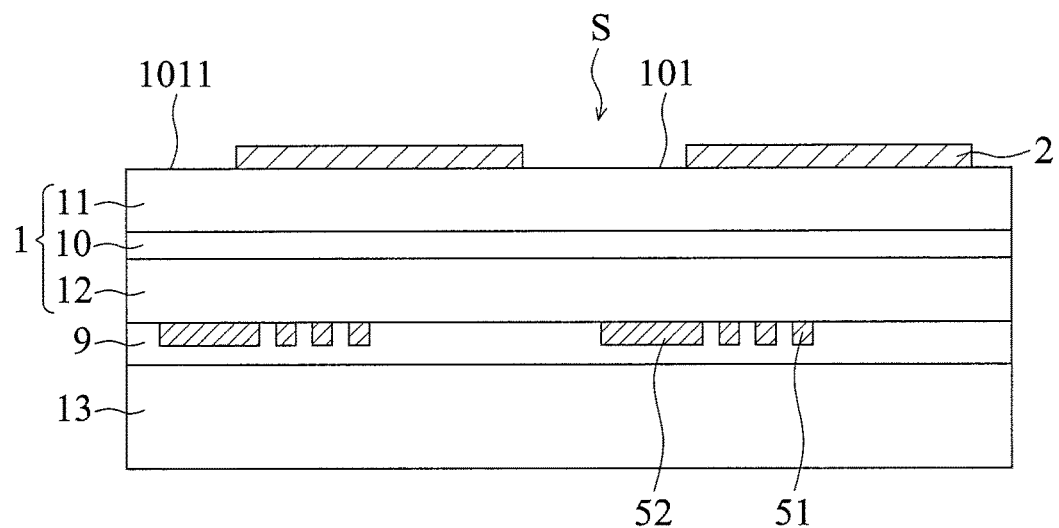

As shown in FIG. 3D, the structure in FIG. 3C is overturned and a plurality of the reflective conductive layers 2 separated from each other are formed to covered the bottom surface 101 of the semiconductor stack 1. There is a gap S between adjacent reflective conductive layers 2 to expose the first portion 1011 of the bottom surface 101 of the semiconductor stack 1. The position of each of the reflective conductive layer 2 corresponds with the first extending portion 51 and the connecting portion 52 of the second electrode 5.

Figure 3E:
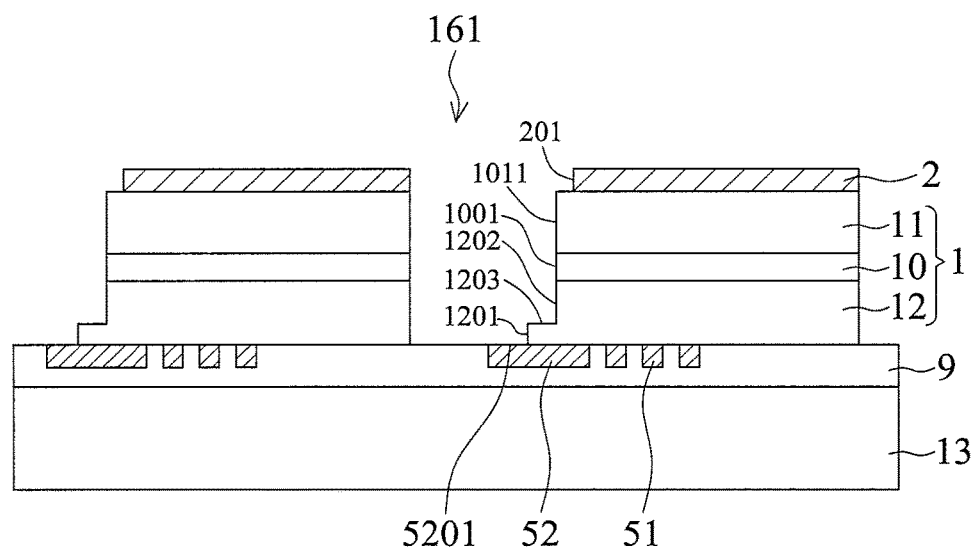

Next, as shown in FIG. 3E, a portion of the semiconductor stack 1 is removed by wet etching or dry etching to form a trench 161 to expose a portion of the first bottom surface 5201 of the connecting portion 52 of the second electrode 5, the first side surface 1201, the platform 1203 and the second side surface 1202 of the second semiconductor layer 12, the first side surface 1001 of the active layer 10, and the first side surface 1101 of the first semiconductor layer 11.

Figure 3F:
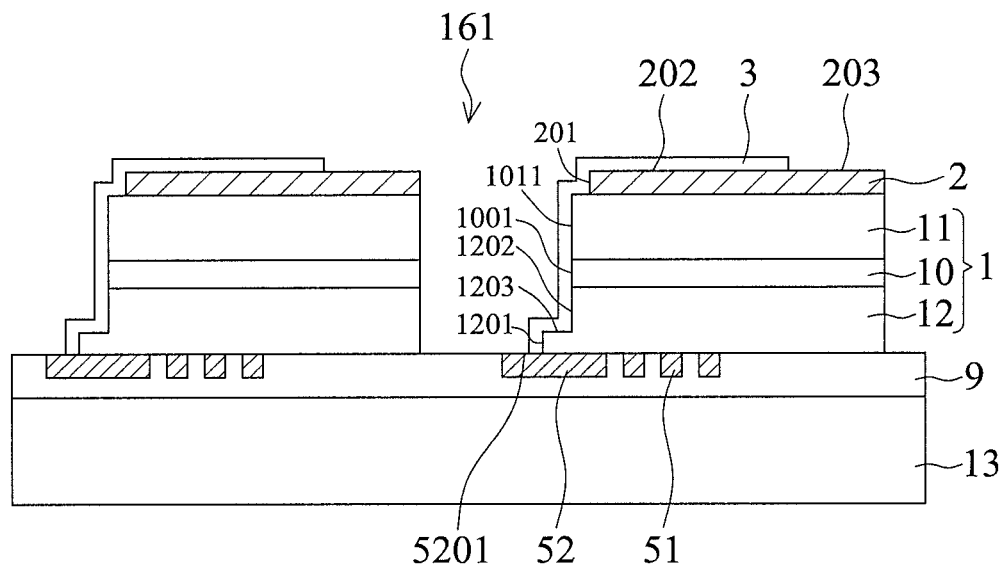

As shown in FIG. 3F, the insulating layer 3 is formed on the first portion 202 of the bottom surface of the reflective conductive layer 2. The second portion 203 of the bottom surface of the reflective conductive layer 2 is exposed. The insulating layer 3 extends along a direction toward the trench 161 on the side of the semiconductor stack 1. In details, the insulating layer 3 covers the first side surface 201 of the reflective conductive layer 2, the first side surface 1101 of the first semiconductor layer 11, the first side surface 1001 of the active layer 10, the first side surface 1201, the platform 1203, and the second side surface 1202 of the second semiconductor layer 12. The insulating layer 3 is in contact with a portion of the first bottom surface 5201 of the connecting portion 52.

Figure 3G:
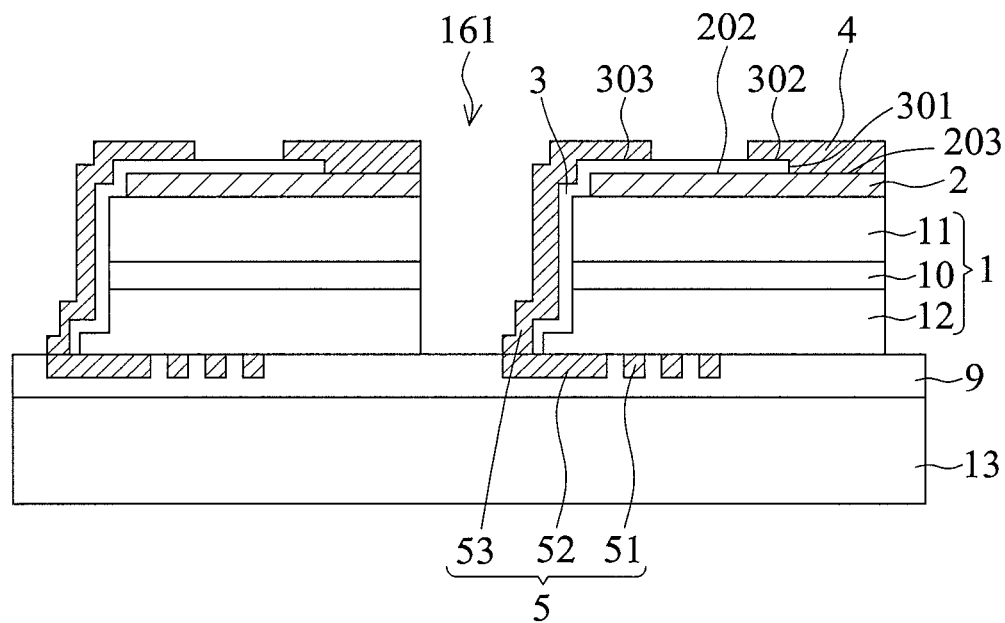

As shown in FIG. 3G, the first electrode 4 is formed on a portion of the insulating layer 3 and covers the second portion 203 of the bottom surface of the reflective conductive layer 2, the first side surface 301, and the first portion 302 of the bottom surface of the insulating layer 3. The second extending portion 53 of the second electrode 5 is formed on a portion of the insulating layer 3 and covers the second upper surface 303 of the insulating layer 3. The second extending portion 53 extends along a direction toward the trench 161 and further covers the portion of the insulating layer 3 in the trench 161 and is connected to the connecting portion 52 of the second electrode 5.

Figure 3H:
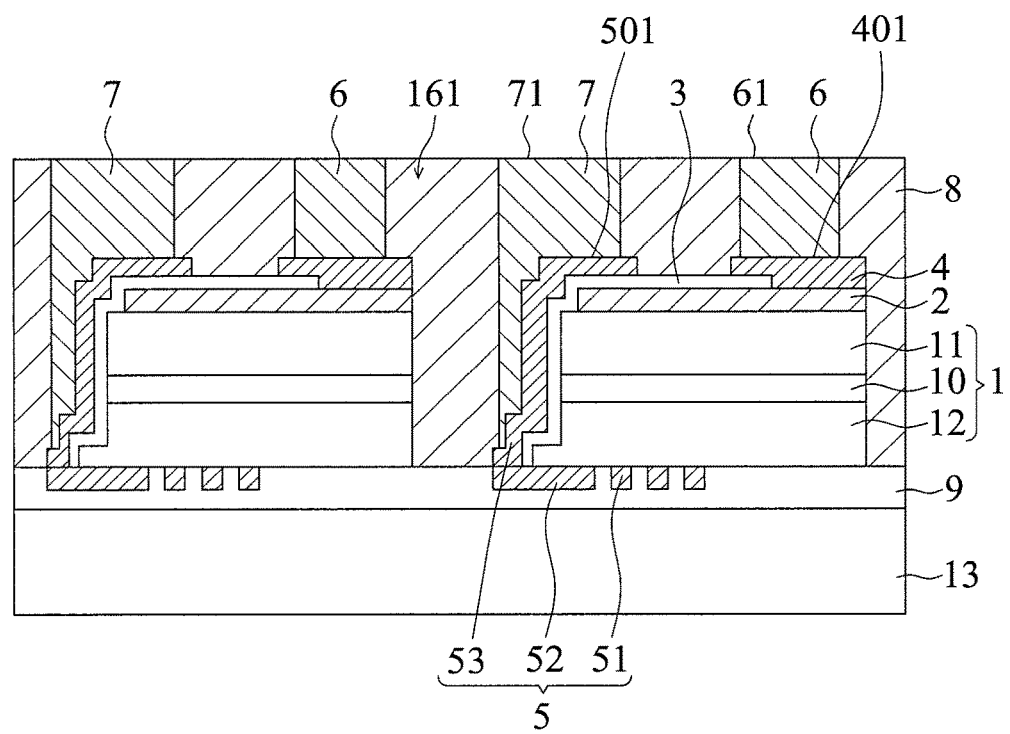

As shown in FIG. 3H, the first electrode post 6 is formed on the bottom surface 401 of the first electrode 4 and a second electrode post 7 is formed on the bottom surface 501 of the second electrode 5. To be more specific, the positions of the electrode posts are defined by masks (not shown) and then filling metal by electroplating, plating, or screen printing. Then, the masks are removed. The second electrode post 7 covers a part of the side surface of the second extension 53 of the second electrode 5. The bottom surface 61 of the first electrode post 6 is substantially coplanar with the bottom surface 71 of the second electrode post 7. After forming the electrode posts, the reflective insulating layer 8 is formed by a method such as screen printing, coating, dispensing, sputtering, and molding. Therefore, the reflective insulating layer 8 is formed to surround the semiconductor stack 1, the reflective conductive layer 2, the insulating layer 3, the first electrode 4, the second electrode 5, the first electrode post 6, and the second electrode post 7, and the bottom surface 61 of the first electrode post 6 and the bottom surface 71 of the second electrode post 7 are exposed.

Figure 3I:
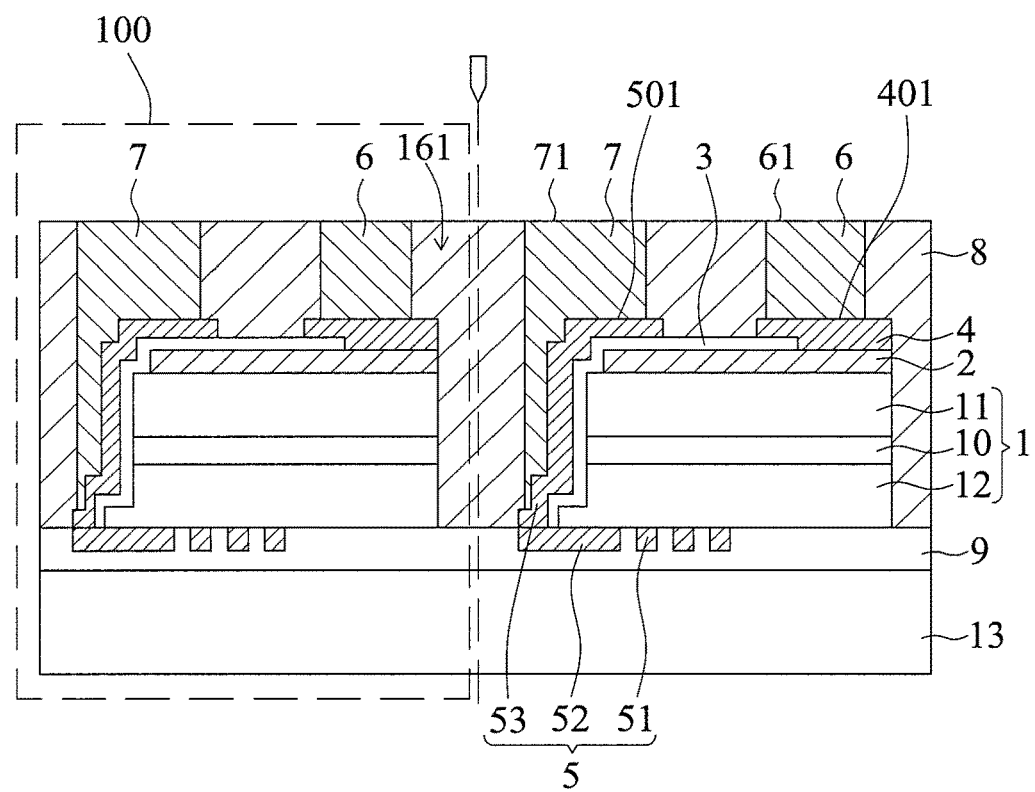

As shown in FIG. 3I, a cutting process is performed along the trench 161 to form a plurality of separated light-emitting devices 100.

Figure 4:
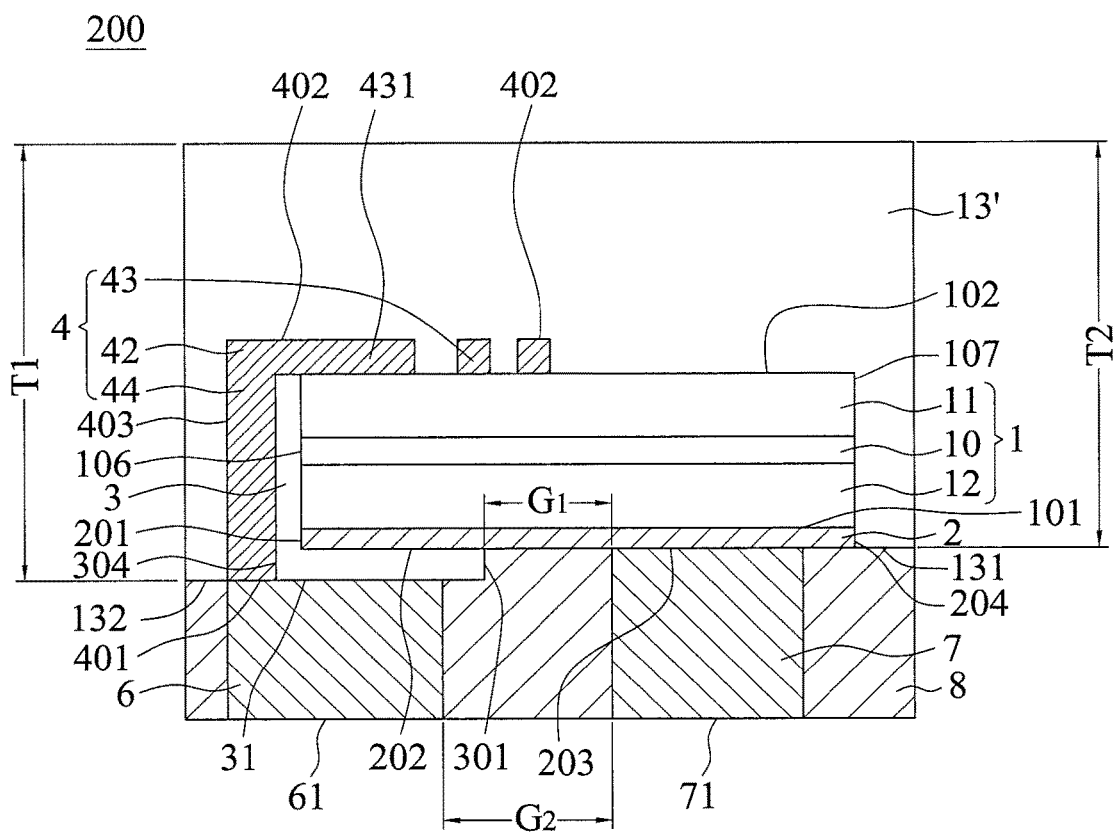
FIG. 4 shows a cross-sectional view of a light-emitting device in accordance with one embodiment of the present disclosure.
Figure 5A:
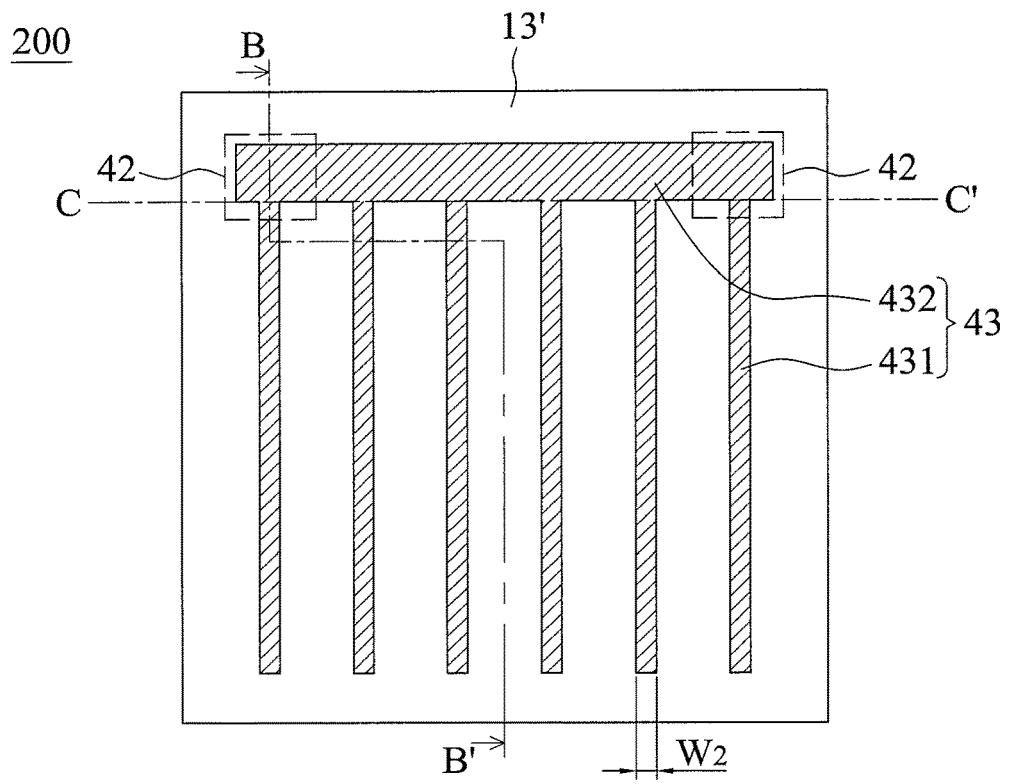
FIG. 5A shows a stop view of a light-emitting device in accordance with one embodiment of the present disclosure.
Figure 5B:
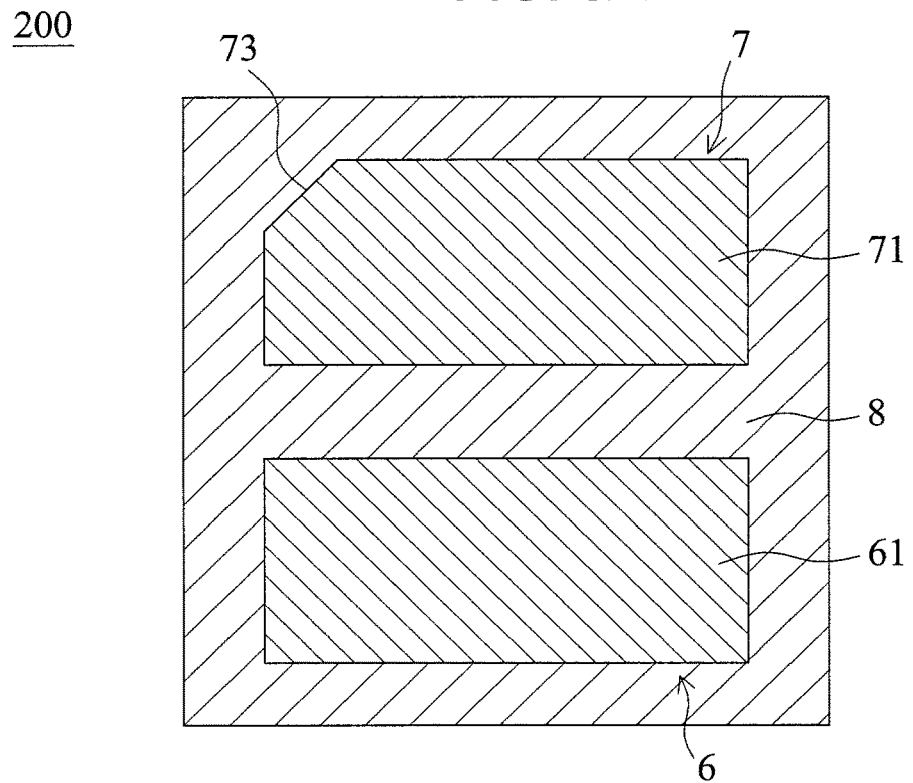
FIG. 5B shows a bottom view of a light-emitting device in accordance with one embodiment of the present disclosure.

FIG. 4 shows a schematic view of a light-emitting device in accordance with one embodiment of the present disclosure. FIG. 5A shows a top view of a light-emitting device 200, FIG. 5B shows a bottom view of the light-emitting device 100. FIG. 4 shows a cross-sectional view along the line BB' in FIG. 5A. As shown in FIG. 4, the light-emitting device 200 includes a semiconductor stack 1, a reflective conductive layer 2, an insulating layer 3, a first electrode 4, a first electrode post 6, a second electrode post 7, a reflective insulating layer 8, and a supporting structure 13'. The semiconductor stack 1 includes a first semiconductor layer 11, a second semiconductor layer 12, and an active layer 10 formed between the first semiconductor layer 11 and the second semiconductor layer 12. The first semiconductor layer 11 and the second semiconductor layer 12 have different types of conductivity, electrical properties, polarities, or dopants to provide electrons or holes. The active layer 10 is formed between the first semiconductor layer 11 and the second semiconductor layer 12 to convert electricity into light. The wavelength of the light can be adjusted by modifying the physical composition(s) and/or chemical composition(s) one or more layers of the semiconductor stack 1. The material of the semiconductor stack 1 includes aluminum gallium indium phosphide (AlGaInP) based material, aluminum gallium indium nitride (AlGaInN) based material, and zinc oxide (ZnO) based material. The active layer 10 can be a single heterostructure (SH), a doubleheterostructure (DH), a double-side double heterostructure (DDH), or a multi-quantum well (MWQ). To be more specific, the active layer 10 may be a neutral conductive type, a p-type or an n-type semiconductor layer. When the current flows through the semiconductor stack 1, the active layer 10 emits light. When the active layer 10 includes aluminum indium gallium phosphide (AlGaInP) based material, the red, orange, yellow and amber light can be emitted; blue or green light can be emitted when the active layer 10 includes aluminum gallium nitride (AlGaInN) based material. In one embodiment, the semiconductor stack 1 includes $Al_xIn_yGa_{(1-x-y)}P$, where $0 \leq x$, $y \leq 1$; $(x+y) \leq 1$ and emits a red light having a peak wavelength or dominant wavelength between 610 nm and 650 nm.

As shown in FIG. 4, the reflective conductive layer 2 is formed on the bottom surface 101 of the semiconductor stack 1 to be electrically connected to the second semiconductor layer 11. The reflective conductive layer 2 includes metal of high reflectivity to reflect the light from the active layer 10, and the light is emitted from the light-emitting surface 102. The reflective conductive layer 2 includes germanium (Ge), gold (Au), beryllium (Be), silver (Ag), gold (Au), aluminum (Al), indium (In), nickel (Ni), tin (Sn), platinum (Pt), titanium (Ti), stack or alloy of the metal above. The insulating layer 3 covers the first side surface 106 of the semiconductor stack 1, the first side surface 201 of the reflective conductive layer 2, and the first portion 202 of the bottom surface of the reflective conductive layer 2. The second portion 203 of the bottom surface of the reflective conductive layer 2 is not covered by the insulating layer 3. The material of the insulating layer 3 contains organic material or inorganic material. The organic material can be Su8, benzocyclobutene (BCB), perchlorocyclobutane (PFCB), epoxy resin (Epoxy), acrylic resin (Acrylic Resin), cycloolefin polymer (COC), polymethylmethacrylate (PMMA), polyethylene terephthalate (PET), polycarbonate (PC), polyetherimide, or fluorocarbon polymer. The inorganic material can be silicone, glass, alumina ($Al_2O_3$), silicon nitride ($SiN_x$), silicon oxide ($SiO_2$), titanium dioxide ($TiO_2$), or magnesium fluoride ($MgF_2$).

As shown in FIGS. 4 and 5, the first electrode 4 includes a first extending portion 43, a connecting portion 42, and a second extending portion 44. The first extending portion 43 is located on the light-emitting surface 102 of the semiconductor stack 1 and is electrically connected to the first semiconductor layer 11. The connecting portion 42 is formed on the light emitting surface 102 of the semiconductor stack 1 and is located at the corner of the semiconductor stack 1 to be connected with the second extending portion 44 and the first extending portion 43. The second extending portion 44 extends from the connection portion 42 to the semiconductor stack 1 and is formed on the second side surface 304 of the insulating layer 3 opposing the semiconductor stack 1. The bottom surface 401 of the first electrode 4 is substantially coplanar with the bottom surface 31 of the insulating layer 3. Thus, the first electrode 4 is separated from the active layer 10, the second semiconductor layer 12, and the reflective conductive layer 2 by the insulating layer 3.

As shown in FIG. 5A, the first extending portion 43 includes a plurality of first extending electrode 431 being parallel with each other, and the second extending electrode 432. The first extending portion 431 has a width W2, which is in a range between 7 μm to 9 μm. The second extending electrode 432 is connected to the connecting portions 42 at the corners of the semiconductor stack 1. The two of the first extending electrodes 431 located on the outermost position are directly connected to the connecting portions 42. The first extending electrode 431 not connected to the connecting portion 42 is vertically connected to the second extending electrode 432 to form a plurality T-shaped contours in the intersections. In another embodiment, similar with the structure in FIG. 2A, the first extension electrode 431 and the second extension electrode 432 cross each other to form a plurality of cross-shaped intersections. The top view of the first extending portion 43 of the first electrode 4 and the connecting portion 42 is not limited to the embodiments shown above, and can be forks shaped, arc-shaped, or radial shaped. The first extending portion 43 and the connecting portion 42 include metal and transparent oxide. The metal can be gold (Au), germanium (Ge), beryllium (Be), nickel (Ni), palladium (Pd), zinc (Zn), alloys of the above materials, or a stack of the above materials. The transparent oxide can be indium tin oxide (ITO), indium oxide (InO), tin oxide (SnO), cadmium tin oxide (CTO), antimony tin oxide (ATO), aluminum zinc oxide (AZO), zinc tin oxide (ZTO) or zinc oxide (ZnO). The second extending portion 44 includes titanium (Ti), tungsten (W), platinum (Pt), nickel (Ni), tin (Sn), gold (Au) or alloys thereof.

The first electrode post 6 is formed on the bottom surface 401 of the first electrode 4 and the bottom surface 31 of the insulating layer 3 and is electrically connected to the first electrode 4. The second electrode post 7 is formed under the second portion 203 of the bottom surface of the reflective conductive layer 2 and is electrically connected to the reflective conductive layer 2. The second electrode post 7 does not completely cover the second portion 203 of the bottom surface of the reflective conductive layer 2. In detail, the distance between the first electrode post 6 and the second electrode post 7 has a distance G2 greater than 0, and the first side surface 301 of the insulating layer 3 and the second electrode post 7 also has a distance G1 greater than 0. In one embodiment, the distance G2 is larger than the distance G1. In another embodiment, the distance G2 is substantially the same as the distance G1. The bottom surface 61 of the first electrode post 6 is substantially coplanar with the bottom surface 71 of the second electrode post 7. The height of the first electrode post 6 is smaller than that of the second electrode post 7. As shown in FIG. 5B, the bottom surfaces 61, 71 of the first electrode post 6 and the second electrode post 7 have appearances similar with a quadrangular. In order to distinguish the conductivity type of the first electrode post 6 and the second electrode post 7 by their appearance, the shapes of the bottom surfaces of the first electrode post 6 and the second electrode post 7 can be different. In one embodiment, the bottom surface of the second electrode post 7 has an oblique edge 73 as a sign of anode or to show its electrical connection with the p-type semiconductor layer. So, the first electrode post 6 is a cathode or electrical connected to the n-type semiconductor layer. However, the shapes of the bottom surfaces 61, 71 are not limited to the shapes shown in the figure, and the shape can be oval, round, triangular, square, polygonal, or the combination of the above shapes. The first electrode post 6 and the second electrode post 7 may include gold (Au), copper (Cu), tin (Sn), antimony (Sb), silver (Ag), titanium (Ti), platinum (Pt), nickel (Ni), alloys of the above materials, or a stack of the above materials. In one embodiment, the first electrode post 6 and the second electrode post 7 includes tin-antimony alloy. In another embodiment, the first electrode post 6 and the second electrode post 7 includes a stack having titanium and copper.

The supporting structure 13' covers the upper surface 402 and the side surface 403 of the first electrode 4, the light emitting surface 102 of the semiconductor stack 1, the second side surface 107 which is on the opposing side of the first side surface 106 of the semiconductor stack 1, and the side surface 204 of the reflective conductive layer 2 which is not covered by the insulating layer 3. It is noted, the supporting structure 13' covers the light-emitting surface 102 of the semiconductor stack 1 and also the side surface of the semiconductor stack 1. The supporting structure 13' has a first bottom surface 131 and a second bottom surface 132 which are not on the same horizontal level. The first bottom surface 131 is substantially coplanar with the second portion 203 of the bottom surface of the reflective conductive layer 2. The second bottom surface 132 of the supporting structure 13' is substantially coplanar with the bottom surface 401 of the first electrode 4. In other words, the supporting structure 13' has two different thicknesses T1 and T2.

Referring to FIG. 4, the supporting structure 13' covers the first extending portion 43, the connecting portion 42, and the second extending portion 44 of the first electrode 4 and has a maximum thickness T1 on the side close to the first electrode post 6 and a maximum thickness T2 on the side close to the second electrode post 7, wherein the thickness T1 is larger than the thickness T2. The supporting structure 13' includes a material transparent or translucent with respect to the light emitted from the active layer 10, such as silicone, epoxy, polymide (PI), benzocyclobutene (BCB), perchlorocyclobutane (PFCB), Su8, acrylic resin (Acrylic Resin), polymethylmethacrylate (PMMA), polyethylene terephthalate (PET), polycarbonate (PC), polyetherimide, fluorocarbon polymer, alumina ($Al_2O_3$), SINR, spin-on glass (SOG), or a combination of the above materials. In one embodiment, the supporting structure 13' includes a wavelength conversion material, such as inorganic phosphor, organic fluorescent colorant, semiconductor, or a combination of the above materials.

The reflective insulating layer 8 covers the bottom surface of the reflective conductive layer 2 which is not covered by the second electrode post 7 or the insulating layer 3. The reflective insulating layer 8 also covers the first bottom surface 131 and the second bottom surface 132 of the supporting structure 13'. The reflective insulating layer 8 further covers the side surface of the first electrode post 6, the side surface of the second electrode post 7. Moreover, the reflective insulating material of the reflective insulating layer 8 fills the gap between the first electrode post 6 and the second electrode post 7. However, the reflective insulating layer 8 does not cover the bottom surface 61 of the first electrode post 6 and the bottom surface 71 of the second electrode post 7. The first electrode post 6 and the second electrode post 7 can be electrically connected to an external circuit device. The reflective insulating layer 8 can protect the semiconductor stack 1 and reflect the light from the active layer 10 so the light is emitted from the light emitting surface 102 of the semiconductor stack 1. The reflective insulating layer 8 includes a mixture of a matrix and a high reflectivity material. The matrix can be a silicone-based or epoxy-based material; the high reflectivity material can be titanium dioxide, silicon dioxide, or alumina.

Figure 6A:
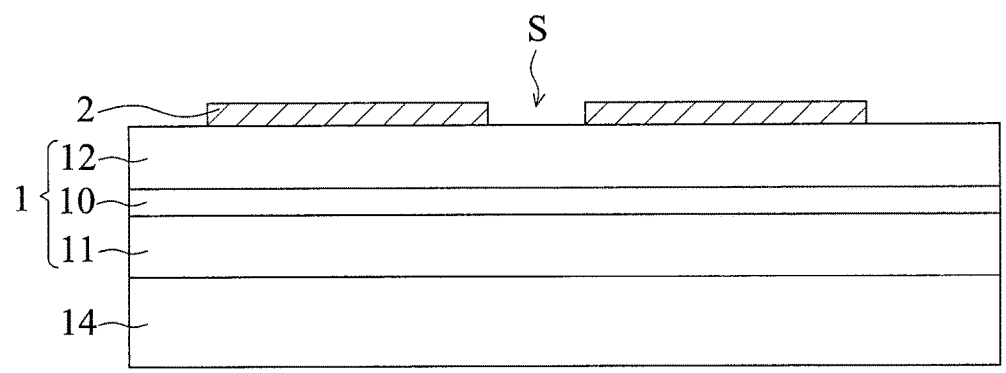
FIGS. 6A~6H show a manufacturing process of a light-emitting device in accordance with one embodiment of the present disclosure.

FIGS. 6A~6H show a manufacturing process of a light-emitting device in accordance with one embodiment of the present disclosure. As shown in FIG. 6A, a growth substrate 14 is provided to form a semiconductor stack 1 including a first semiconductor layer 11, an active layer 10, and a second semiconductor layer 12 on the growth substrate 14. The growth substrate 14 includes sapphire, silicon carbide (SiC), gallium nitride (GaN), gallium arsenide (GaAs), or gallium phosphide (GaP). A plurality of separated reflective conductive layers 2 are formed on a surface of the semiconductor stack 1 opposing to the growth substrate 14, and there is a gap S between the adjacent reflective conductive layers 2.

Figure 6B:
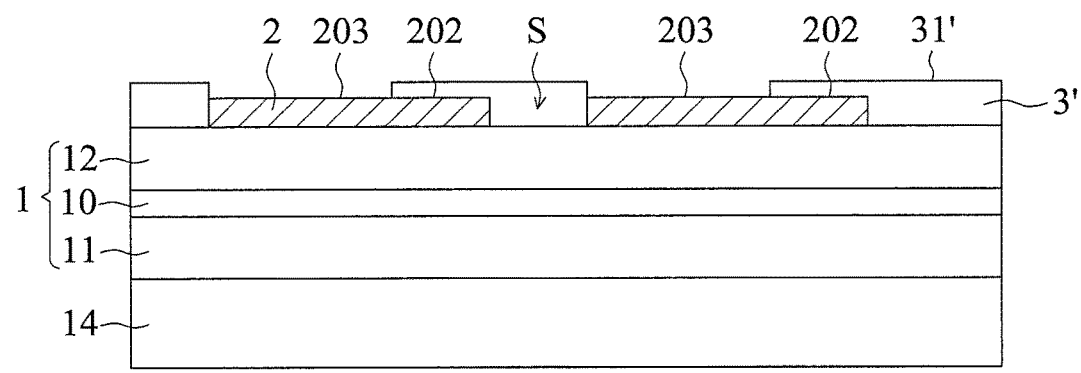

As shown in FIG. 6B, the first insulating layer 3' fills the gap S and covers the first portion 202 of the bottom surface of the reflective conductive layers 2 so the second portion 203 of the bottom surface of the reflective conductive layer 2 is exposed.

Figure 6C:
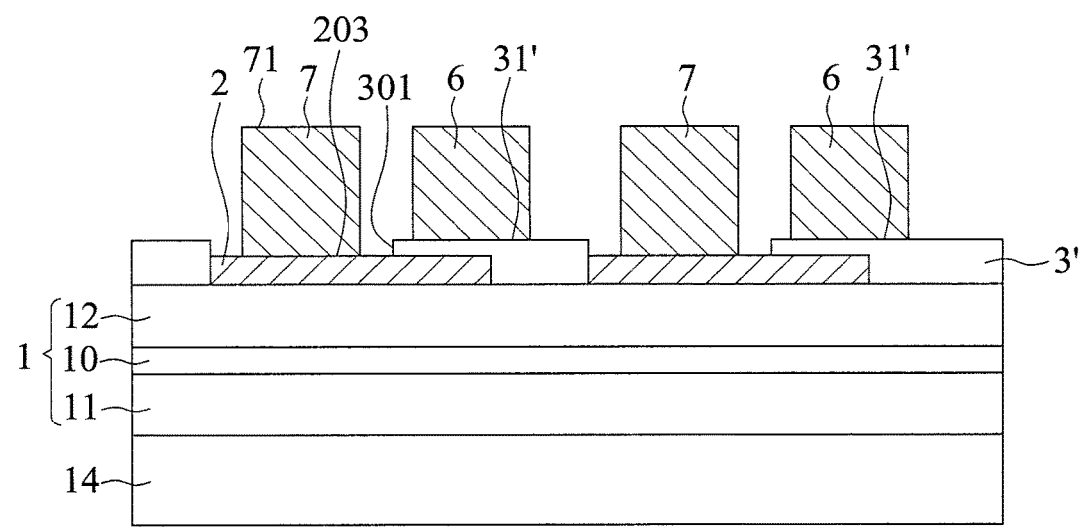

Subsequently, as shown in FIG. 6C, the first electrode post 6 is formed on the bottom surface 31' of the first insulating layer 3' and the second electrode post 7 is formed on the second portion 203 of the bottom surface of the reflective conductive layer 2 by electro plating or plating. The width of the second electrode post 7 is smaller than the width of the second portion 203 of the bottom surface of the reflective conductive layer 2. That is, the second portion 203 of the bottom surface of the reflective conductive layer 2 has a portion not covered by the second electrode post 7, and the side surface of the second electrode post 7 is not in contact with the side surface of the first insulating layer 3'.

Figure 6D:
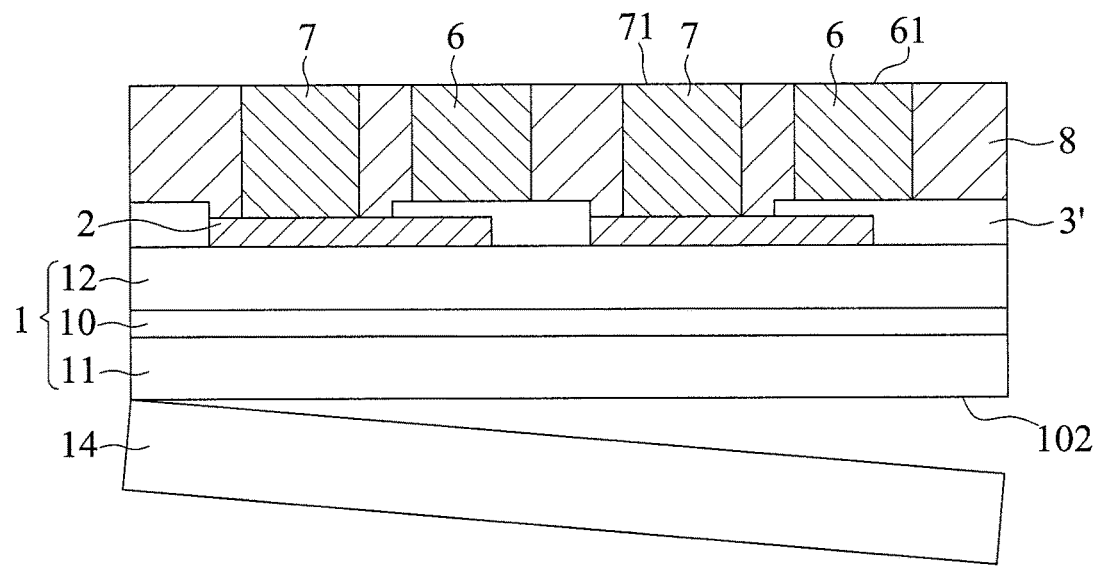

As shown in FIG. 6D, the reflective insulating layer 8 can be formed by a method such as screen printing, coating, spraying, dispensing, sputtering, and molding. The reflective insulating layer 8 covers the bottom surface of the first insulating layer 3' which is not covered by the first electrode post 6, the bottom surface of the reflective conductive layer 2 which is not covered by the second electrode post 7, and the side surfaces of the first electrode post 6 and the second electrode post 7, and exposes the bottom surface 61 of the first electrode post 6 and the bottom surface 71 of the second electrode post 7. Subsequently, the growth substrate 14 is separated from the semiconductor stack 1 and the light emitting surface 102 of the semiconductor stack 1 is exposed. The method of separation can be referred to FIG. 3C and its related sections above.

Figure 6E:
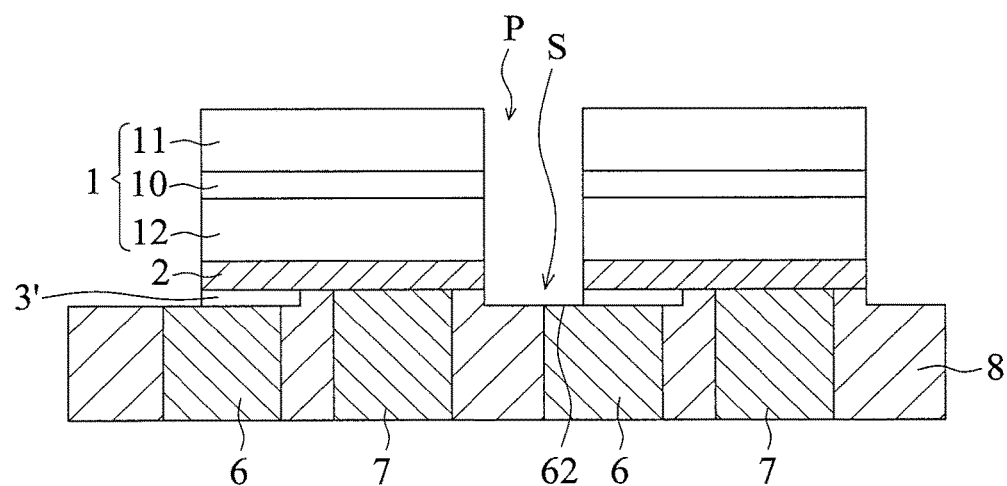

As shown in FIG. 6E, the structure in FIG. 6D is flipped over and the semiconductor stack 1 is cut along the gap S between adjacent reflective conductive layer 2. The part of the upper surface 62 of the first electrode post 6 at the gap S is exposed to form the cutting path P.

Figure 6F:
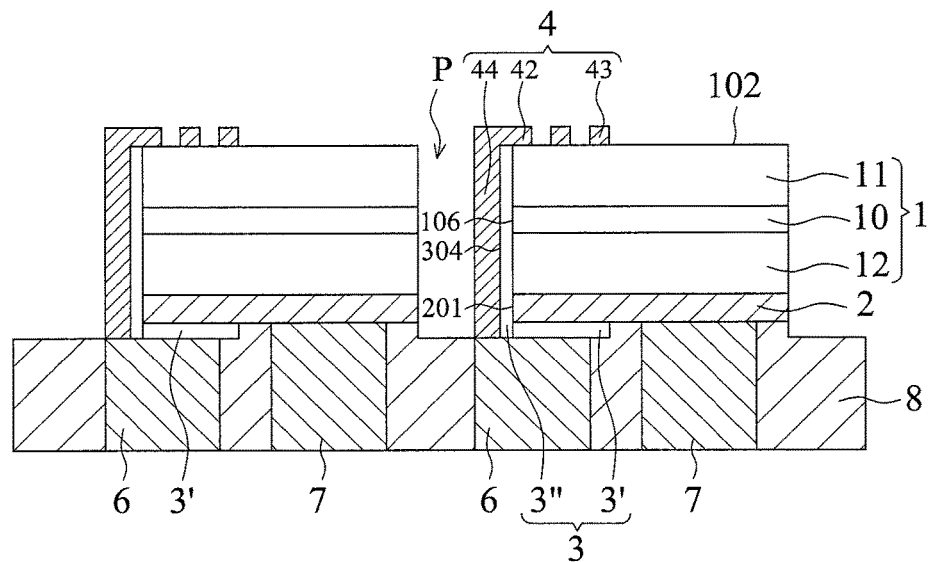

Referring to FIG. 6F, the second insulating layer 3" is formed in the cutting path P to cover the first side surface 106 of the semiconductor stack 1 and the first side surface 201 of the reflective conductive layer 2. The second insulating layer 3" is in contact with the first insulating layer 3'. In this embodiment, the insulating layer 3 is combined by the first insulating layer 3' and the second insulating layer 3". (The boundary between the first insulating layer 3' and the second insulating layer 3" is drawn for clarity. In reality, the boundary is presented or vanished depending on the process conditions or materials applied.) The first extending portion 43 and the connecting portion 42 of the first electrode 4 are formed on the light emitting surface 102 of the semiconductor stack 1 by vapor deposition. The second extending portion 44 is formed to cover the second side surface 304 of the insulating layer 3. The first extending portion 43 and the connecting portion 42 are physically connected to each other on the light emitting surface 102 while the second extending portion 44, the connecting portion 42, and the first electrode post 6 are physically connected to each other.

Figure 6G:
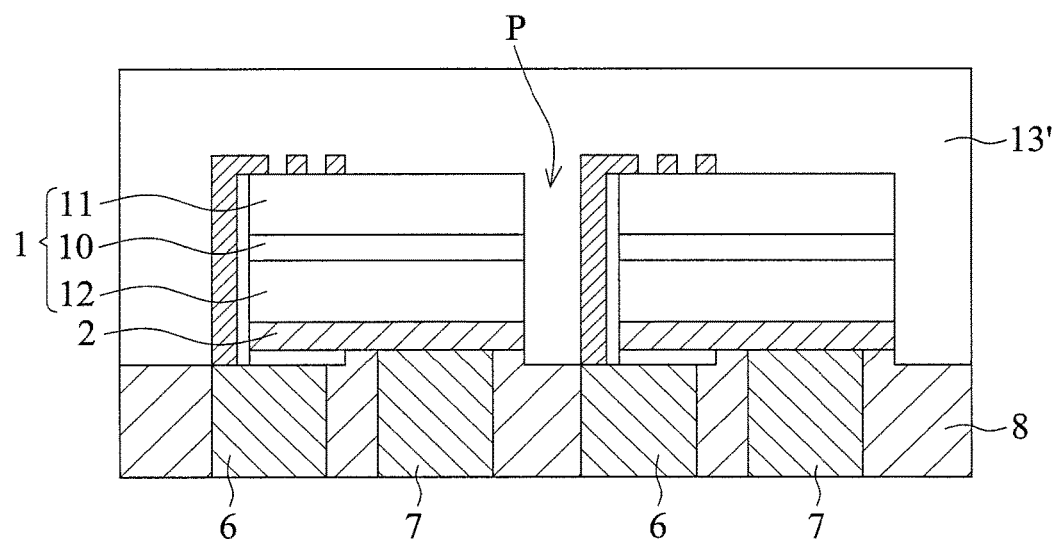

Referring to FIG. 6G, the supporting structure 13' can be formed by a method, such as screen printing, coating, spraying, dispensing, sputtering and molding. The supporting structure 13' can be filled into the cutting path P and covers the first electrode 4.

Figure 6H:
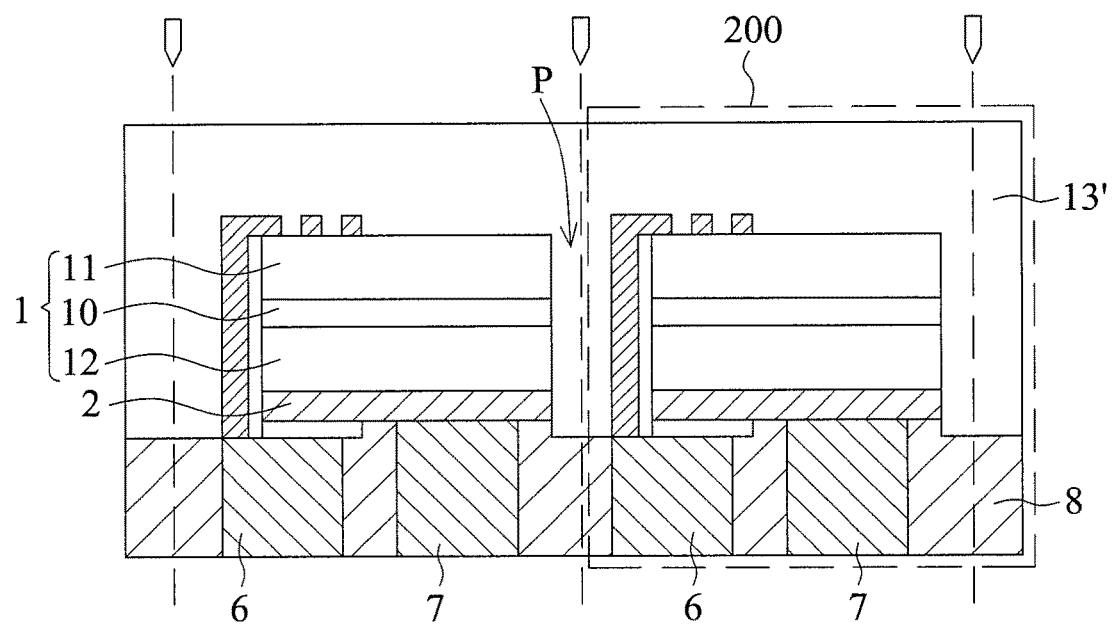

Referring to FIG. 6H, the cutting process is then applied along the cutting path P to form separated light-emitting devices 200.

FIGS. 7A~7G show a manufacturing process of a light-emitting device in accordance with one embodiment of the present disclosure. The same reference numerals or symbols as those described in the previous processes represent similar or same elements or devices, which can be referred to corresponding descriptions above, and are not described again for brevity.

Figure 7A:
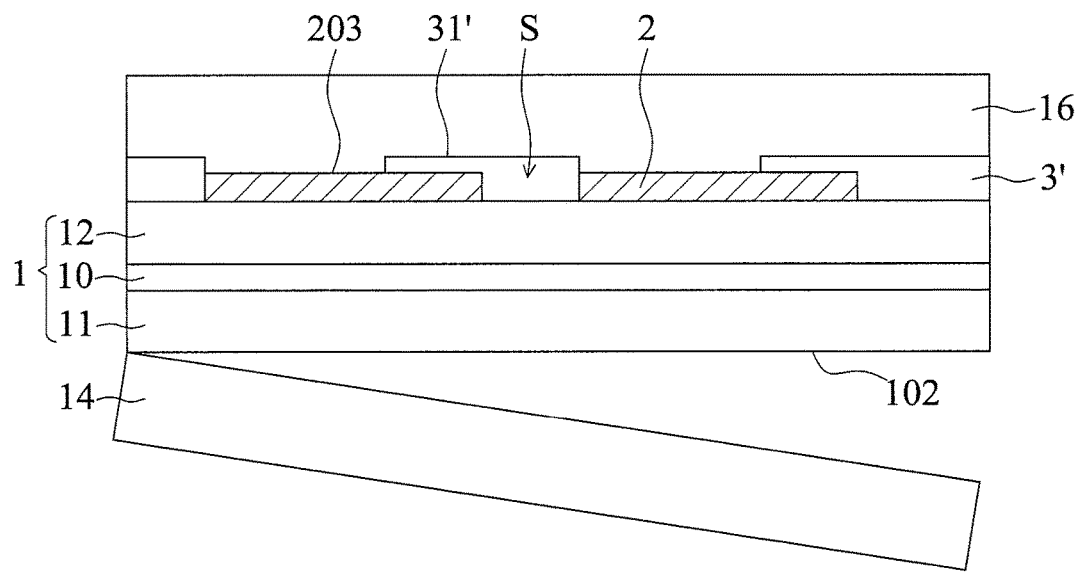
FIGS. 7A~7G show a manufacturing process of a light-emitting device in accordance with one embodiment of the present disclosure.

As shown in FIG. 7A, a temporary carrier 16 having an adhesive property is adhered to the top of the upper surface 31' of the first insulating layer 3' and the second portion 203 of the bottom surface of the reflective conductive layer 2. Then, the growth substrate 14 is separated from the semiconductor stack 1 to expose the light emitting surface 102 of the semiconductor stack 1. The method of separation can be referred to FIG. 3C and its related sections above. The temporary carrier 16 includes thermal release tape, UV tape, chemical release tape, heat resistant tape, or blue tape.

Figure 7B:
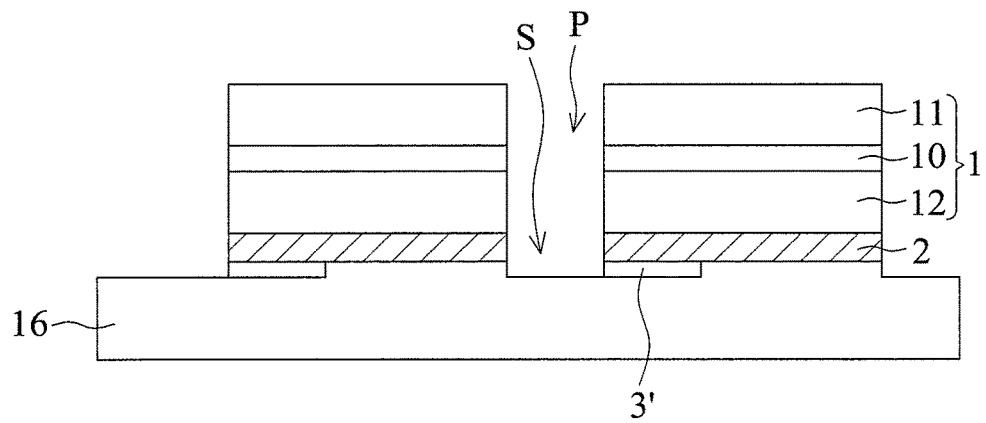

As shown in FIG. 7B, the structure in FIG. 7A is flipped over to cut the semiconductor stack 1 along the gap S to form the cutting path P. It is noted, the cutting step may form a cut, but does not substantially separate the temporary carrier 16. In other words, the semiconductor stack 1 is still fixed to the temporary carrier 16.

Figure 7C:
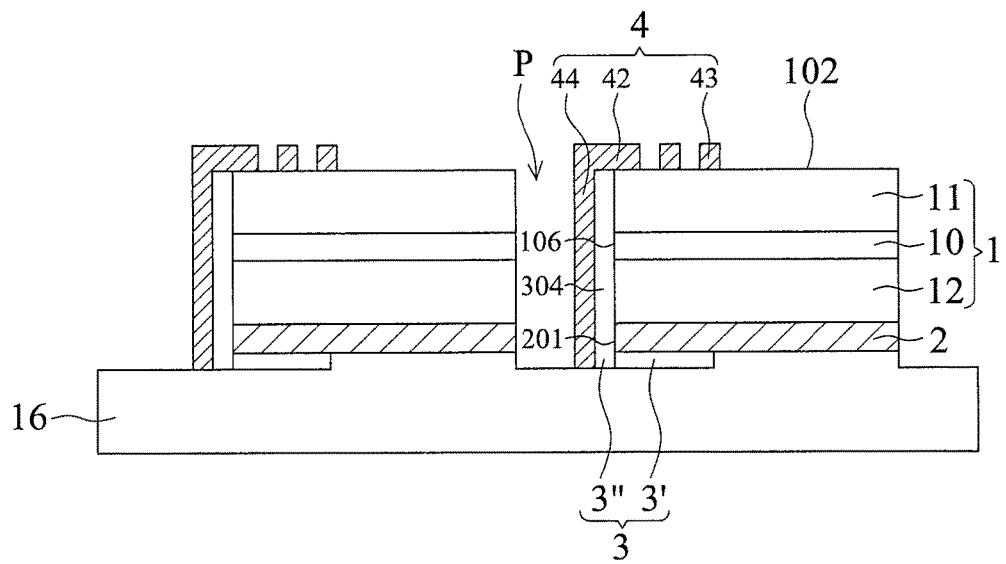

Referring to FIG. 7C, the second insulating layer 3" is formed in the cutting path P to cover the first side surface 106 of the semiconductor stack 1 and the first side surface 201 of the reflective conductive layer 2. The second insulating layer 3" is in contact with the first insulating layer 3'. In this embodiment, the insulating layer 3 is combined by the first insulating layer 3' and the second insulating layer 3". The first extending portion 43 and the connecting portion 42 of the first electrode 4 are formed on the light emitting surface 102 of the semiconductor stack 1 by vapor deposition. The second extending portion 44 is formed to cover the second side surface 304 of the insulating layer 3. The first extending portion 43 and the connecting portion 42 are physically connected to each other on the light emitting surface 102, and the second extending portion 44, the connecting portion 42, and the first electrode post 6 are physically connected to each other.

Figure 7D:
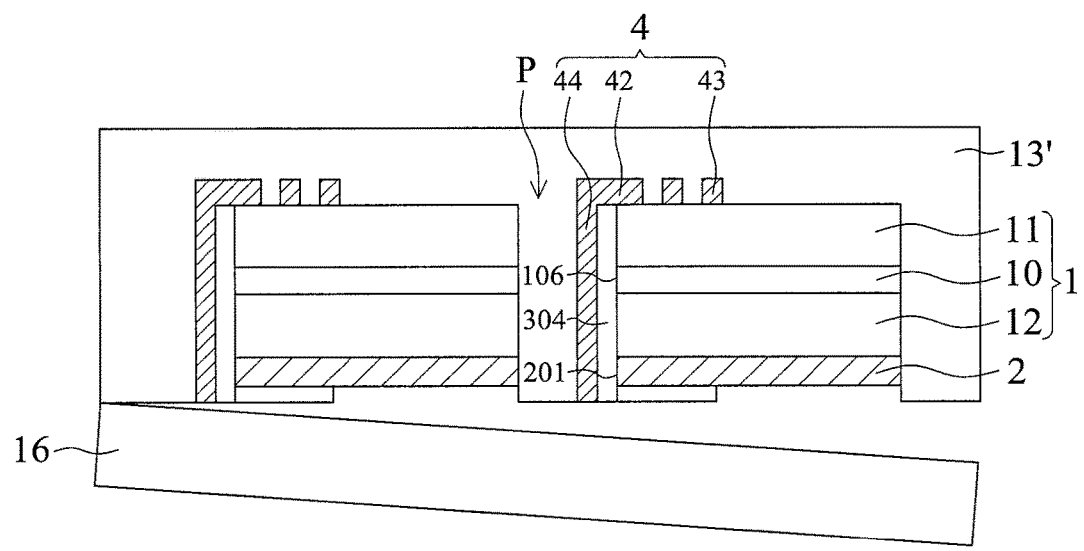

Referring to FIG. 7D, the supporting structure 13' can be formed by a method, such as screen printing, coating, brush coating, spin coating, spraying, dispensing, sputtering and molding. The supporting structure 13' can be filled into the cutting path P and covers the first electrode 4. The temporary carrier 16 can be removed by method such as laser stripping, heating separation, dissolution, or irradiation of ultraviolet light in the following step.

Figure 7E:
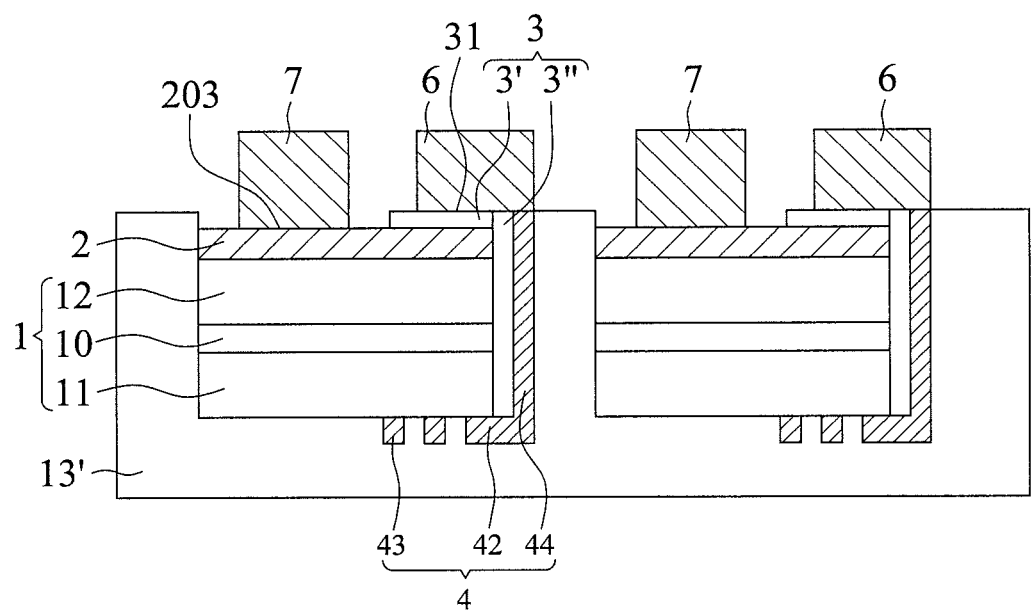

Subsequently, as shown in FIG. 7E, the first electrode post 6 is formed on the bottom surface 31 of the first insulating layer 3 and the second electrode post 7 is formed on the second portion 203 of the bottom surface of the reflective conductive layer 2 by electro plating or plating. The width of the second electrode post 7 is smaller than the width of the second portion 203 of the bottom surface of the reflective conductive layer 2. That is, the second portion 203 of the bottom surface of the reflective conductive layer 2 has a portion not covered by the second electrode post 7, and the side surface of the second electrode post 7 is not in contact with the side surface of the first insulating layer 3'.

Figure 7F:
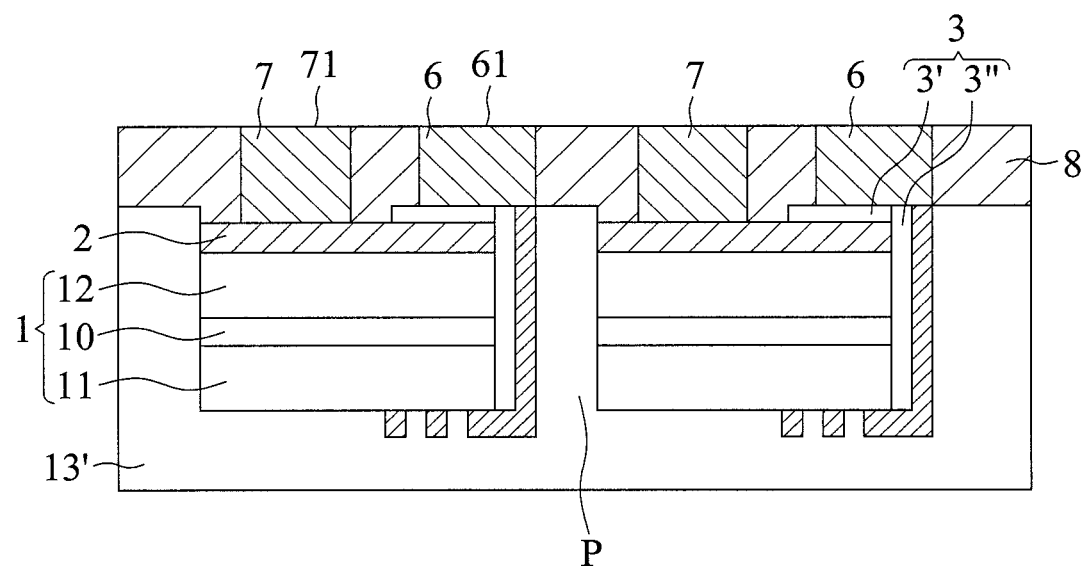

As shown in FIG. 7F, the reflective insulating material 8 can be formed by a method such as screen printing, coating, spraying, dispensing, sputtering, and molding. The reflective insulating layer material 8 covers the bottom surface of the first insulating layer 3 which is not covered by the first electrode post 6, the bottom surface of the reflective conductive layer 2 which is not covered by the second electrode post 7, and the side surfaces of the first electrode post 6 and the second electrode post 7, and exposes the bottom surface 61 of the first electrode post 6 and the bottom surface 71 of the second electrode post 7.

Figure 7G:
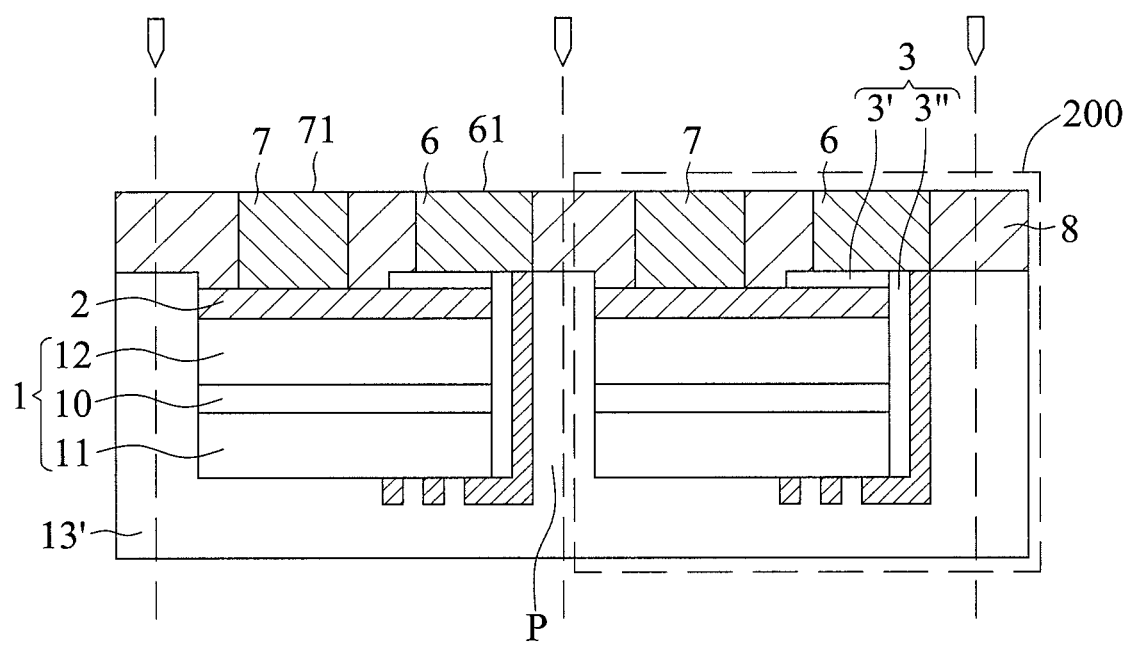

Referring to FIG. 7G, the cutting process is then applied along the cutting path P to form separated light-emitting devices 200.

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a semiconductor stack comprising a side surface, a first bottom surface and a first upper surface opposite to the first bottom surface;
   an electrode post formed on the first bottom surface and comprising an outer side surface;
   a reflective insulating layer covering the outer side surface and comprising a second bottom surface substantially coplanar with the electrode post;
   an electrode electrically connected to the electrode post and comprising a first portion formed on the first upper surface and a second portion covering the side surface; and
   a supporting structure formed on the first portion.

2. The light-emitting device according to claim 1, wherein the semiconductor stack comprises $Al_xIn_yGa_{(1-x-y)}P$.

3. The light-emitting device according to claim 1, wherein the electrode post comprises tin-antimony alloy.

4. The light-emitting device according to claim 1, wherein the supporting structure comprises a wavelength conversion material.

5. The light-emitting device according to claim 1, wherein the supporting structure covers the side surface and the first upper surface.

6. The light-emitting device according to claim 1, wherein the reflective insulating layer surrounds the semiconductor stack.

7. The light-emitting device according to claim I, wherein the supporting structure includes glass.

8. The light-emitting device according to claim 1, wherein the supporting structure includes silicone or epoxy.

9. The light-emitting device according to claim 1, wherein the light emitting device has a height H1, and the supporting structure has a height H2, and a ratio of H1/H2 is less than 1.5.

10. The light-emitting device according to claim 1, further comprising a light emitted from the semiconductor stack and traveling along a direction away from the extending electrode.

11. The light-emitting device according to claim 1, wherein the light emitting device has a height H1, and the electrode post has a height H3, and a ratio of H1/H3 is in a range of 8-15.

12. The light-emitting device according to claim 1, wherein the electrode directly connects to the electrode post.

13. The light-emitting device according to claim 1, further comprising an adhesive layer formed between the semiconductor stack and the supporting structure.

14. The light-emitting device according to claim 1, further comprising an insulating layer formed between the electrode and the semiconductor stack.

15. The light-emitting device according to claim 14, wherein the insulating layer covers the side surface and the first bottom surface.

16. The light-emitting device according to claim 1, further comprising a reflective conductive layer on the first bottom surface.

17. The light-emitting device according to claim 16, wherein the electrode formed on the reflective conductive layer.

18. The light-emitting device according to claim 1, wherein the semiconductor stack comprises a first semiconductor layer, a second semiconductor layer farer from the electrode post than the first semiconductor layer, and an active layer between the first semiconductor layer and the second semiconductor layer, and the electrode electrically connects to the second semiconductor layer.

19. The light-emitting device according to claim 18, wherein the second semiconductor layer has a platform, and an insulating layer covers the platform and is between the platform and the electrode.

20. The light-emitting device according to claim 18, wherein the second semiconductor layer has a first side surface and a second side surface which are not coplanar with each other, and an insulating layer covers the first side surface and the second side surface.

* * * * *